(12) United States Patent
Lin et al.

(10) Patent No.: US 10,094,875 B1
(45) Date of Patent: Oct. 9, 2018

(54) METHODS, SYSTEMS, AND ARTICLES OF MANUFACTURE FOR GRAPH-DRIVEN VERIFICATION AND DEBUGGING OF AN ELECTRONIC DESIGN

(71) Applicant: Cadence Design Systems, Inc., San Jose, CA (US)

(72) Inventors: Chien-Liang Lin, San Jose, CA (US); Andrea Iabrudi Tavares, Belo Horizonte (BR); Chung-Wah Norris Ip, Cupertino, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 58 days.

(21) Appl. No.: 15/087,871

(22) Filed: Mar. 31, 2016

(51) Int. Cl.
*G01R 31/317* (2006.01)

(52) U.S. Cl.
CPC . *G01R 31/31704* (2013.01); *G01R 31/31703* (2013.01)

(58) Field of Classification Search
CPC .......... G06F 19/24; G06F 19/18; G06F 19/28; C40B 30/02; G01R 31/31704; G01R 31/31703
See application file for complete search history.

(56) References Cited

U.S. PATENT DOCUMENTS

| 6,073,194 | A  | * | 6/2000  | Lowe ..................... G06F 11/221 703/13 |
| 7,065,726 | B1 |   | 6/2006  | Singhal et al. |
| 7,137,078 | B2 |   | 11/2006 | Singhal et al. |
| 7,159,198 | B1 |   | 1/2007  | Ip et al. |
| 7,437,694 | B1 |   | 10/2008 | Loh et al. |
| 7,506,288 | B1 |   | 3/2009  | Ip et al. |
| 7,647,572 | B1 |   | 1/2010  | Lundgren et al. |
| 7,895,552 | B1 |   | 2/2011  | Singhal et al. |
| 8,863,049 | B1 |   | 10/2014 | Lundgren et al. |
| 9,633,151 | B1 |   | 4/2017  | Sun et al. |
| 2009/0125766 | A1 | * | 5/2009 | Safarpour ........... G06F 17/5045 714/724 |
| 2016/0232292 | A1 | * | 8/2016 | Key ........................ G06F 19/24 |

* cited by examiner

Primary Examiner — Kyle Vallecillo
(74) Attorney, Agent, or Firm — Vista IP Law Group, LLP

(57) ABSTRACT

Disclosed are techniques for implementing graph-driven verification and debugging of an electronic design. These techniques identify a pair of interest that comprises a target signal and a clock cycle or an event associated with the target signal from a verification or simulation result of an electronic design or a portion thereof. A boundary for relevant driver identification (RDI) operations may be identified for normal termination of the performance of one or more RDI operations. A debug graph may then be generated and stored at least by performing one or more RDI operations for at least the pair of interest based in whole or in part upon the boundary for RDI operations.

24 Claims, 25 Drawing Sheets

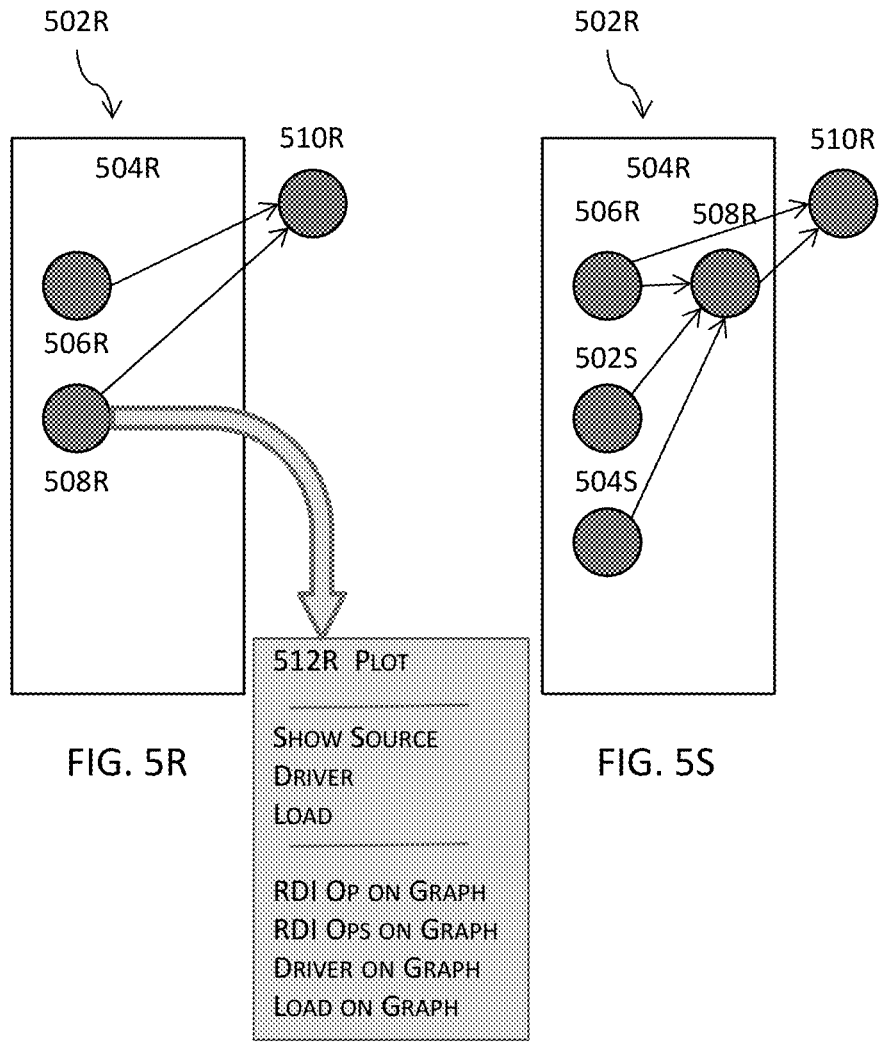

__(1)__

METHODS, SYSTEMS, AND ARTICLES OF MANUFACTURE FOR GRAPH-DRIVEN VERIFICATION AND DEBUGGING OF AN ELECTRONIC DESIGN

COPYRIGHT NOTICE

A portion of the disclosure of this patent document contains material, which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

Modern electronic design automation (EDA) tools are devised to communicate design intent and the circuit behavior between a circuit designer and other technical personnel such as design team member. With the number of transistors in an integrated circuit (IC) doubling approximately every two years according to the Moore's law, contemporary electronic designs have become increasingly bigger and more complex over time. Verification or simulation is often performed to determine whether an electronic design performs as intended. Due to the ever increasing complexity of modern electronic designs, verification or simulation of an electronic design rarely leads to an error-free design and thus may require further debugging.

Conventional approaches present a challenge that requires many manual, tedious tasks to chase a signal that exhibits a particular value in a specific clock cycle. This challenge is further exacerbated when an electronic design includes complex logic that leads from one node to a plurality of nodes, some of which may further branch off to even more nodes. Therefore, a user of these conventional approaches is often presented with cluttered pieces of information deeply within which the information corresponding to the actual cause of signal exhibiting the particular value in the specific clock cycle is buried. For example, in response to a command to show the driver for a particular signal-cycle pair, conventional approaches may nevertheless present a plurality of candidate drivers that may contribute to the particular signal-cycle pair but may not necessarily do so in the specific clock cycle. The user is thus required to sift through such cluttered pieces of information, hoping that the answer can be identified before the user is disoriented by these cluttered pieces of information.

Therefore, there exists a need for a method, system, and computer program product for graph-driven verification and debugging of electronic designs with a debug graph and optionally a schematic view that may be generated on the fly in response to an identification of a signal-cycle pair.

SUMMARY

Disclosed are method(s), system(s), and article(s) of manufacture for graph-driven verification and debugging of an electronic design in various embodiments. Some first embodiments are directed at a method for graph-driven verification and debugging of an electronic design. In these embodiments, a pair of interest that comprises a target signal and a clock cycle or an event associated with the target signal may be identified from a verification or simulation result of an electronic design or a portion thereof. A boundary for relevant driver identification (RDI) operations may be identified for normal termination of the performance of one or more RDI operations. A debug graph may then be generated and stored at least by performing one or more RDI operations for at least the pair of interest based in whole or in part upon the boundary for RDI operations.

In some of these embodiments, the electronic design may be ensured to be ready for manufacturing at least by generating a verified or debugged electronic design by verifying or debugging the electronic design using the debug graph and by running the verified or debugged electronic design through sign-off. In addition or in the alternative, the electronic design or the portion thereof may be verified or debugged at least by performing one or more RDI playback operations within a range of clock cycles for the debug graph; the electronic design or the portion thereof may be verified or debugged at least by performing one or more RDI preview operations for the debug graph; or the electronic design or the portion thereof may be verified or debugged at least by performing one or more RDI plot operations for the debug graph.

In some embodiments, the debug graph may be integrated with a main debug or verification display module that comprises a functional information display sub-module and a structural information display sub-module at least by synchronizing the debug graph with the main debug or verification display module. In some of these embodiments, integrating the debug graph with the main debug or verification display module may identify an entity in the debug graph. A signal corresponding to the entity may be emphasized in the functional information display sub-module of the main debug or verification display module. A signal declaration corresponding to the entity may also be emphasized in the structural information display sub-module of the main debug or verification display module. A driver corresponding to the entity may also be emphasized in a driver or load display sub-module of the main debug or verification display module.

In some embodiments, the debug graph may be incrementally constructed or updated by using at least an RDI operation or recursive RDI operations at multiple levels. In some of these embodiments, a node may be identified in the debug graph; one or more RDI levels of RDI operations may be identified; and for a first RDI level of the one or more RDI levels, one or more first RDI signals may be identified at least by performing a first RDI operation for the node identified in the debug graph.

In some of the immediately preceding embodiments, the debug graph may be updated by adding the one or more first RDI signals as one or more first additional nodes to the debug graph and by connecting the one or more first additional nodes to the node identified in the debug graph. In addition or in the alternative, one or more second RDI signals may be identified at least by performing one or more additional RDI operation for one or more first additional nodes for an additional RDI level of the one or more RDI levels. The debug graph may be updated by adding the one or more second RDI signals as one or more second additional nodes to the debug graph and also by connecting the one or more second additional nodes to the one or more first additional nodes.

In some embodiments, the target signal corresponding to the pair of interest may be identified; and a target node may be generated in the debug graph to represent the target signal. The debug graph may then be updated with one or more RDI signals for at least the target node. In some of these embodiments, whether one or more additional RDI operations are to be performed may be determined based in part or in whole upon the boundary for RDI operations; and when it is determined that the one or more RDI operations are to be performed, the debug graph may be recursively updated using results of performance of the one or more additional RDI operations.

In addition or in the alternative, an RDI fanin cone for the target signal may be determined at least by performing one or more structural analyses, one or more functional analyses, or a combination of one or more functional analyses and one or more functional analyses; and the one or more RDI signals may be determined based in part or in whole upon the RDI fanin cone for the target signal.

In some of these immediately preceding embodiments, a first RDI signal may be identified form the one or more RDI signals; and hierarchical information may also be optionally identified for the first RDI signal using structural information of the electronic design or the portion thereof. The first RDI signal may be represented as a first RDI node in the debug graph; and the first RDI node may be connected to the target node with a first edge.

In some embodiments, an entity in the debug graph may be identified. A schematic view comprising a schematic representation of the entity may then be generated in response to identification of the entity; and the schematic view may further be synchronized with the debug graph. In some of these embodiments, the schematic view may be updated at least by performing one or more one or more expansion operations or by performing one or more one or more RDI operations in the schematic view.

Some embodiments are directed at an article of manufacture that includes a non-transitory machine-accessible storage medium having stored thereupon a sequence of instructions which, when executed by at least one micro-processor or at least one processor core, causes the at least one micro-processor or the at least one processor core to perform any of the methods, processes, or sub-processes disclosed herein. Some illustrative forms of the non-transitory machine-readable storage media may also be found in the System Architecture Overview section below.

More details of various aspects of the methods, systems, or articles of manufacture for implementing coplanar waveguide transmission lines in an electronic design are described below with reference to FIGS. 1-6.

BRIEF DESCRIPTION OF THE DRAWINGS

The drawings illustrate the design and utility of various embodiments of the invention. It should be noted that the figures are not drawn to scale and that elements of similar structures or functions are represented by like reference numerals throughout the figures. In order to better appreciate how to obtain the above-recited and other advantages and objects of various embodiments of the invention, a more detailed description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which:

FIGS. 5R-S jointly illustrate an example of incremental generation of a debug graph in one or more embodiments.

DETAILED DESCRIPTION

Figure 1:
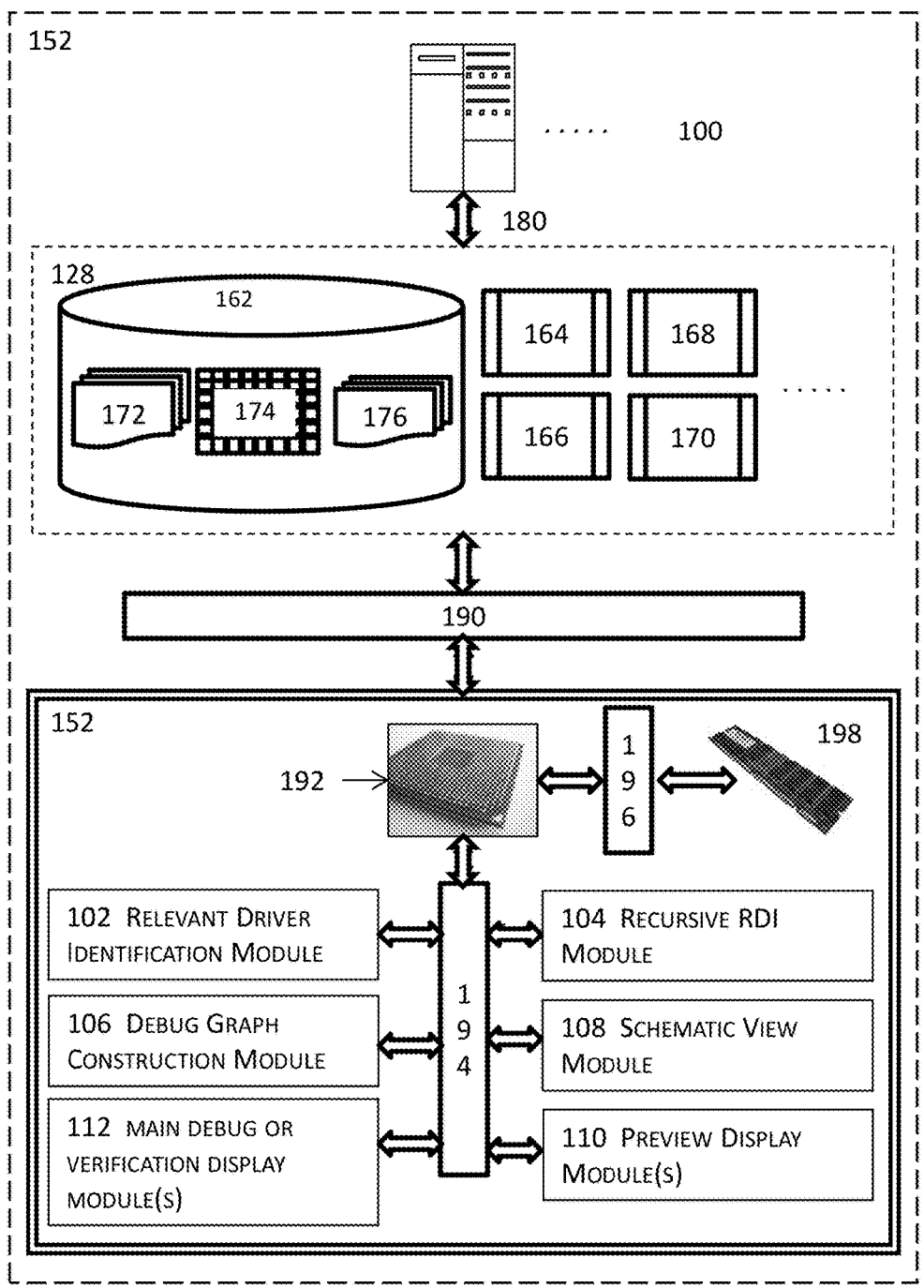
FIG. 1 illustrates a high level schematic block diagram for graph-driven verification and debugging of an electronic design in one or more embodiments.

Various embodiments are directed to a method, system, and computer program product for graph-driven verification and debugging of an electronic design. Other objects, features, and advantages of the invention are described in the detailed description, figures, and claims.

In various embodiments, a signal-cycle pair (e.g., signal "A" in the 3,600-th clock cycle) or a signal-event pair for an electronic design of interest or a portion thereof is identified. The signal-cycle pair corresponds to a target signal having a particular target signal value in a specific clock cycle. In response to the identification of the signal-cycle pair, one or more RDI (relevant driver identification) operations or recursive RDI operations may be performed to generate one or more RDI signals for the identified signal-cycle pair (or the identified signal-event pair) and one or more subsequently identified RDI signals, if available. A debug graph may then be generated by representing the target signal and the one or more RDI signals as corresponding nodes in the debug graph and further by connecting an RDI node to a node for which the RDI signal represented by the RDI node is determined by an edge in the debug graph.

The debug graph may be integrated with the main debug or verification display module by synchronizing correlated display content between the main debug display module and the debug graph. Verification or debugging of the electronic design may then be performed by using at least the debug graph while using the main debug or verification display module as an optional aid to debugging or verification. The debugged or verified electronic design may then be ensured to be ready for manufacturing by further running the debugged or verified electronic design through various physical design implementation tools and sign-off tools. More details about the methods, systems, and articles of manufacture for graph-driven verification and debugging of an electronic design will be described below with reference to various drawing figures.

Various embodiments of the methods, systems, and articles of manufacture will now be described in detail with reference to the drawings, which are provided as illustrative examples of the invention so as to enable those skilled in the art to practice the invention. Notably, the figures and the examples below are not meant to limit the scope of various embodiments, unless otherwise specifically described in particular embodiment(s) or recited in the claim(s).

Where certain elements of embodiments may be partially or fully implemented using known components (or methods or processes), portions of such known components (or methods or processes) that are necessary for an understanding of the present invention will be described, and the detailed descriptions of other portions of such known components (or methods or processes) will be omitted for ease of explanation and to not obscure embodiments of the invention. Further, embodiments encompass present and future known equivalents to the components referred to herein by way of illustration. More details about various processes or modules to implement various embodiments are further described below with reference to FIGS. 1-5.

FIG. 1 illustrates a high level schematic block diagrams for graph-driven verification and debugging of an electronic design in one or more embodiments. More specifically, FIG. 1 illustrates an illustrative high level schematic block diagrams for graph-driven verification and debugging of an electronic design and may comprise one or more computing systems 100, such as a general purpose computer described in the System Architecture Overview section to implement one or more special proposes.

In some embodiments, the one or more computing systems 100 may invoke various system resources such as the processor(s) or processor core(s), memory, disks, etc. The one or more computing systems 100 may also initiate or interact with other computing systems to access, via a computer bus architecture (e.g., a system bus, a control bus, a data bus, or any combinations thereof), various resources 128 that may comprise a floor planner, a global routing engine, and/or a detail routing engine 164, a layout editor 166, a design rule checker 168, a verification engine 170, etc. The verification engine 170 may perform formal verification tasks in some embodiments.

The one or more computing systems 100 may further write to and read from a local or remote non-transitory computer accessible storage 162 that stores thereupon data or information such as, but not limited to, one or more databases (174) such as schematic design database(s) or physical design database(s), electronic circuit design specification database(s), various statistics, various data, rule decks, various design rules, constraints, etc. (172), or other information or data (176) that may be used to facilitate the performance of various functions to achieve the intended purposes.

In some embodiments, the one or more computing systems 100 may include or, either directly or indirectly through the various resources 128, invoke a set of modules 152 including hardware modules and software modules or combinations of one or more hardware modules and one or more software modules. Each of these modules may include or function in tandem with electrical circuitry and one or more micro-processors each having one or more processor cores to perform its intended functions.

The hardware system may further include one or more forms of non-transitory machine-readable storage media or persistent storage devices to temporarily or persistently store various types of data or information, various design rules, various libraries, selected and selectable targets, or any other suitable information or data, etc. A module is initialized in a computing system so that the software portion of the module is stored in memory (e.g., random access memory) to be executed by one or more processors or processor cores off the computing system to perform at least a part of the functionality of the module. Some illustrative modules or components of the hardware system may be found in the System Architecture Overview section below.

The set of modules 152 may comprise a relevant driver identification (RDI) or a Why module 102 to determine one or relevant signals for an identified or selected signal-cycle pair or a signal-event pair. A signal-cycle pair includes a signal having a particular value in a specific clock cycle and the specific clock cycle. An RDI or Why signal for an identified signal having a specific signal value in a particular clock cycle includes a signal that contributes to the specific signal value or the signal transition to the specific signal value in the particular clock cycle in some embodiments. It shall be noted that the term relevant driver identification (or RDI for abbreviation) and Why are used interchangeably throughout this application. The set of modules 152 may also include a recursive RDI module 104 that identifies a plurality of RDI signals for an identified signal-cycle pair comprising a target signal and a specific clock cycle (or a signal-event pair comprising a target signal associated with a particular event at a specific time step) at least by recursively applying multiple levels of RDI operations for the target signal as well as for one or more subsequently generated RDI signals in some embodiments. A signal-event pair includes a signal associated with a particular event at a specific time step. An RDI or Why signal for an identified first signal associated with a specific first event in a particular first time step includes a second event of a second signal at a particular second time step that contributes to the first event of the first signal in the first time step in some embodiments.

The set of modules 152 may further optionally include a debug graph construction module 106 to generate a debug graph in response to an identified signal-cycle pair. A signal-cycle pair may be identified by a user by, for example, clicking on or specifying a particular signal in a specific clock cycle or by various modules of one or more electronic design automation (EDA) tools. A debug graph may be generated on the fly upon the identification of a signal-cycle pair or in batches for one or more specified signal-cycle pairs.

In addition or in the alternative, the set of modules 152 may include a schematic view module 108 to generate one or more schematic views in response to operations, manipulations, or commands received in a main debug or verification display module, a debug graph, or in any other interfaces of one or more EDA tools. One or more of the modules in 152 may function alone or may function in conjunction with one or more other modules to perform their respective functions for graph-driven verification and debugging of electronic designs.

Figure 5A:
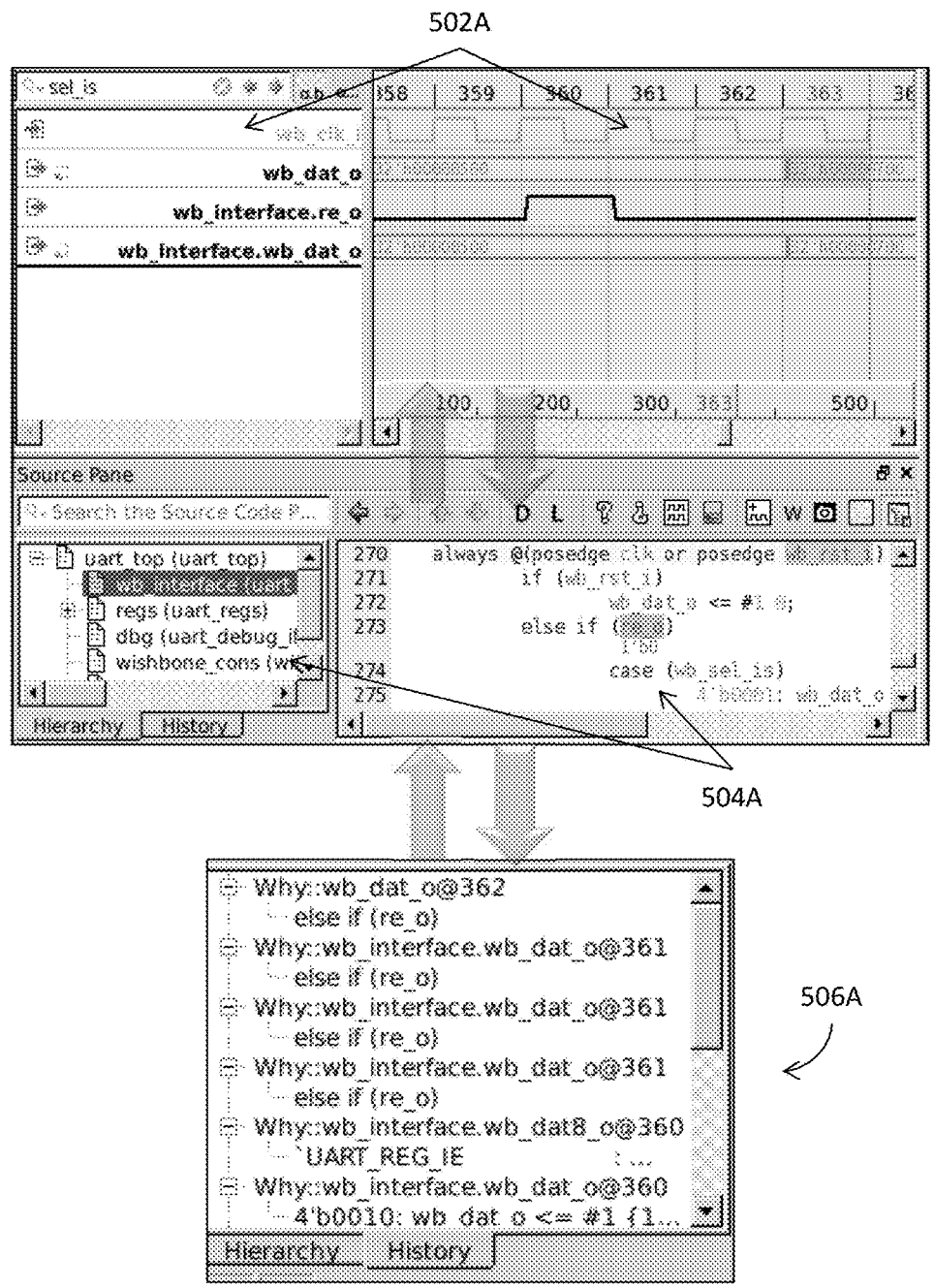
FIG. 5A illustrates an example of a portion of a main debug or verification display module of an electronic design automation tool in one or more embodiments.

The set of modules 152 may also include a main debug or verification display module that may include a main debug or verification display module that may include a functional view module (e.g., a waveform viewer displaying signal waveforms in a range of clock cycles), a structural view module (e.g., a source browser displaying source code segments), a driver or load display module displaying information about one or more drivers and/or one or more loads of an identified signal in some embodiments. One or more of the sub-modules in the main debug or verification display module 112 may also be used to display information of an electronic design of interest in response to one or more plot commands. In some embodiments, information generated in response to one or more preview commands are displayed in the preview display module 110, instead of the main debug or verification display module 112, so as not to clutter the main debug or verification display module 112. FIG. 5A illustrates an example of a portion of a main debug or verification display module 112 of an electronic design automation tool in one or more embodiments.

In this example, the main debug or verification display module may include a functional information display area 502A (e.g., a waveform viewer) to display functional information such as one or more waveforms of one or more corresponding signals in a range of clock cycles. The functional information display area may be interactive to receive a user specification or identification of one or more particular signal-cycle pairs of the corresponding one or more signals in one or more specific cycles. The functional information display area may also be integrated and synchronized with a structural information display area 504A that shows structural information of an electronic design or a portion thereof.

For example, the structural information display area may show the source code segment or the signal declaration of an identified signal or the source code segment or the signal declaration of an identified signal in a specific clock cycle. For example, a user may identify a signal-cycle pair in the functional information display area, and the structural information display area automatically shows the signal declaration of the identified signal or the assignment related to the identified signal-cycle pair. The main debug or verification display module may also include a driver and/or load display module 506A that displays various pieces of information about one or more drivers for a particular signal-cycle pair.

Figure 5B:
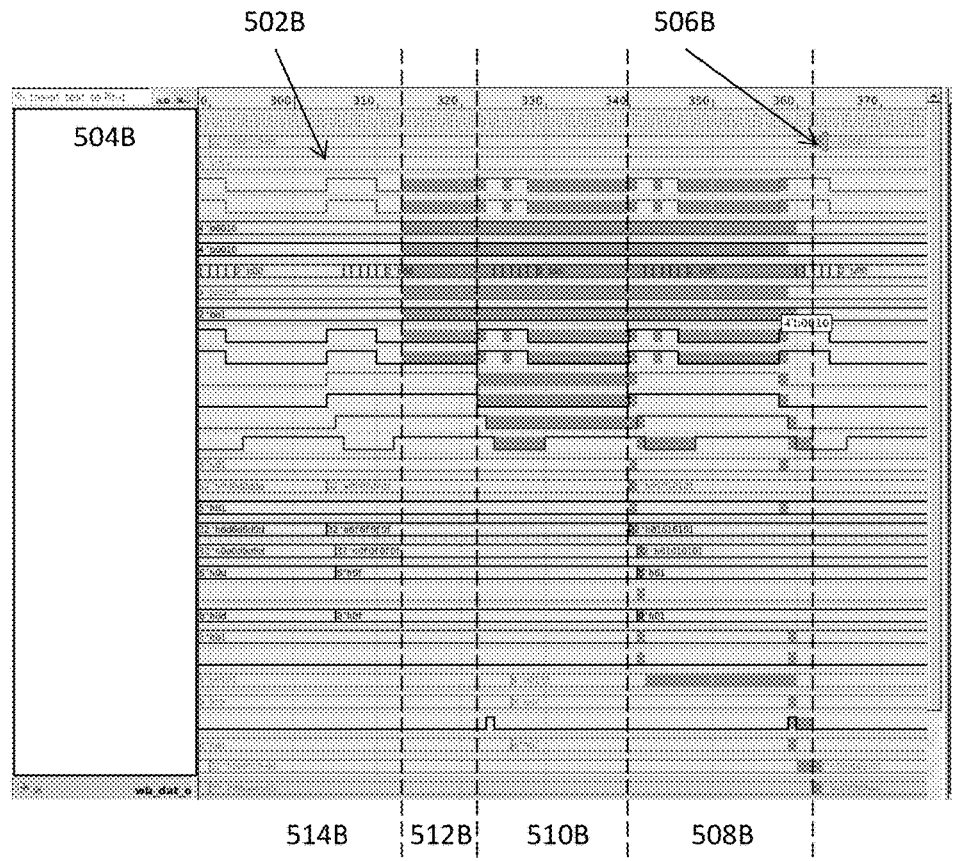
FIG. 5B illustrates another example of a portion of a main debug or verification display module of an electronic design automation tool in one or more embodiments.

FIG. 5B illustrates another example of a portion of a main debug or verification display module of an electronic design automation tool in one or more embodiments. More specifically, FIG. 5B illustrates an example of a functional information display area 502B after the performance of a plurality of RDI operations. In this example, the functional information display area 502B includes a plurality of waveforms and their respective signal identifiers 504B. FIG. 5B further illustrates the functional display of a plurality of RDI or Why operations for an identified signal-cycle pair 506B. Various waveforms with highlighted clock cycles in the vertical slice 508B correspond to the RDI signals that are identified by the performance of multiple levels of RDI or Why operations for the identified signal-cycle pair 506B. A first RDI or Why operation may generate a first number of highlights, while recursive RDI or Why operations on the results of the first RDI signals may add more highlights than the first number of highlights, With the performance of further RDI or Why operations, the RDI signals with highlighted clock cycles or clock cycle ranges are shown in the vertical slice 510B. The vertical slice 512B illustrates the identification of additional RDI or Why signals with highlighted clock cycles or ranges of clock cycles after the performance of more RDI or Why operations, whereas the vertical slice 514B includes no signals with highlighted clock cycles or clock cycle ranges. The absence of any signals with highlighted clock cycles or clock cycle ranges indicate either the end of the RDI operations or that the RDI signals in the previous vertical slice (512B) may constitute primary inputs, and thus the subsequent vertical slice (514B) includes not signals having highlighted clock cycles or clock cycle ranges (no signals are contributing to the signal transitions of previously determined RDI signals.)

The set of modules 152 may include a preview display module 110 that temporarily generates and displays various pieces of information in response to one or more preview commands or operations. These various pieces of information or data generated and displayed may be transiently generated and displayed, and the displayed content in the preview display module 110 may be refreshed and replaced with different content upon the receipt of different preview commands or operations in some embodiments. In these embodiments, these various pieces of information generated and displayed in a preview display module 110 may not be persistently stored.

The set of modules 152 may further optionally include one or more signoff modules (not shown) to perform various signoff and design closure tasks to ensure that the electronic design implemented by various techniques described herein may be successfully fabricated or ready for manufacturing while maintaining various performance, cost, reliability, and manufacturability requirements.

For example, the one or more signoff modules may include one or more timing signoff modules to perform timing analyses and timing closure related tasks (e.g., silicon-accurate timing signoff, signal integrity analyses, etc.) to ensure an electronic design meets power, performance, or other requirements before tapeout, one or more signoff parasitic extraction modules to provide silicon-accurate interconnect parasitic extraction and ensure first-pass silicon success, and one or more power signoff modules to perform various power integrity analyses, transistor-level electromigration and IR-drop analyses, or other power and signal integrity analyses with SPICE-level accuracy or better accuracy with SPICE or SPICE-like simulations (e.g., Fast-SPICE, HSPICE, PSPICE, or any other SPICE-based or SPICE-compatible simulations) to ensure an electronic design meets or exceeds power, performance, and/or area goals in some embodiments.

The one or more signoff modules may include one or more physical verification modules (not shown) to perform various design rule checking, layout vs. schematic (LVS), etc. tasks to ensure that an electronic design meets or exceeds various spatial and other physical rules and one or more design for manufacturing (DFM) modules to address physical signoff and electrical variability optimization, correct lithography hotspots, predict silicon contours, improve yield, detect and repair timing and leakage hotspots to achieve variation- and manufacturing-aware signoff and design closure in some of these embodiments.

In addition or in the alternative, the one or more signoff modules may include one or more one or more computational lithography modules (not shown) to provide more accurate post-etch critical dimension accuracy and process windows on silicon, reticle and wafer synthesis, etc. to eliminate errors and/or reduce mask-manufacturing cycle times. One or more of these multi-fabric signoff modules may operate on the electronic design produced or modified with various techniques to be described in the following sections for proper signoff and design closure so that the signoff version of the electronic design may be properly manufactured with first-pass or fewer passes silicon success in some embodiments. In these embodiments, the signoff version of the electronic design produced or modified with various techniques described herein causes the underlying electronic circuit to be manufactured by a foundry or IC (integrated circuit) fabrication facility when the signoff version of the electronic design is forwarded to the foundry or IC fabrication facility that in turn fabricates the requisite photomasks and the eventual electronic circuit.

In some embodiments, the computing system 100 may include the various resources 128 such that these various resources may be invoked from within the computing system via a computer bus 180 (e.g., a data bus interfacing a microprocessor 192 and the non-transitory computer accessible storage medium 198 or a system bus 190 between a microprocessor 192 and one or more engines in the various resources 128). In some other embodiments, some or all of these various resources may be located remotely from the computing system 100 such that the computing system may access the some or all of these resources via a computer bus 180 and one or more network components.

The computing system may also include one or more modules in the set of modules 152. One or more modules in the set 152 may include or at least function in tandem with a microprocessor 192 via a computer bus 194 in some embodiments. In these embodiments, a single microprocessor 192 may be included in and thus shared among more than one module even when the computing system 100 includes only one microprocessor 192. A microprocessor 192 may further access some non-transitory memory 198 (e.g., random access memory or RAM) via a system bus 196 to read and/or write data during the microprocessor's execution of processes.

Figure 2:
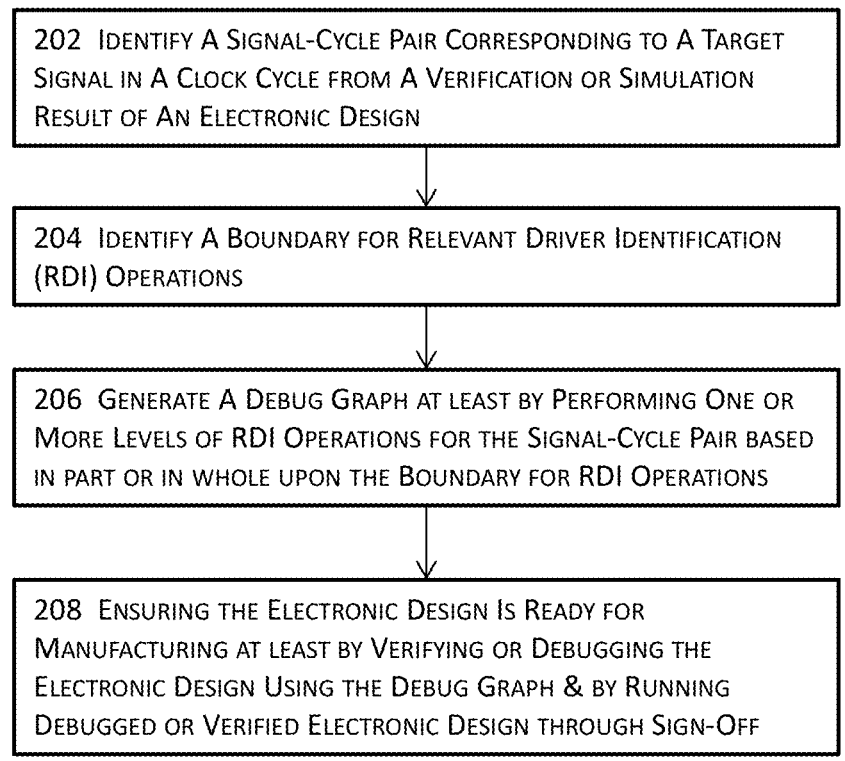
FIG. 2 illustrates a high level block diagram for graph-driven verification and debugging of an electronic design in one or more embodiments.

FIG. 2 illustrates a high level block diagram for graph-driven verification and debugging of an electronic design in one or more embodiments. In these one or more embodiments, a signal-cycle pair may be identified at 202 from a verification or simulation result of an electronic design or a portion thereof. A signal-cycle pair includes a signal having a particular value in a specific clock cycle and the specific clock cycle in some embodiments. For example, the signal-cycle pair {a_o, 17000} includes signal "a_o" in the 17,000-th clock cycle. In an alternate embodiment, a signal-event pair may be used. For example, the signal-event pair {b_o, 512012} includes signal "b_o" with the event that occurs at time step 512012; the event may be a posedge of a signal, negedge, value-change, etc.

A signal-cycle pair may be identified either manually by a user or automatically by one or more modules (e.g., one or more modules described with reference to reference numeral 128) of one or more EDA tools. For example, a designer may identify a signal-cycle pair by clicking on or specifying a particular signal in a specific clock cycle in, for example, a waveform display or viewer. One or more modules of one or more EDA tools may also automatically identify a signal-cycle pair by specifying or prescribing the identification of the signal and the clock cycle corresponding to the signal-cycle pair.

A boundary for performing recursive relevant driver identification (RDI) operations may be identified or determined at 204. One RDI operation analyzes the relevant fanin cone of the target, traversing the fanin cone and typically stopping the traversal at signals with user-visible names, internal nets that correspond to sub-expression in the design source description, etc. The boundary for performing RDI operations may be used to determine whether to perform further RDI operations on the ROI signals from an earlier RDI operation, capturing the extent of performance of RDI operations or when or where the performance of RDI operations normally terminates. The boundary may be defined in a numerous manners or forms and may include, for example, a number of levels of RDI operations, a structural boundary (e.g., the boundary of an instance) which, when hit, causes the performance of RDI operations to terminate, the primary inputs of an electronic design or a portion thereof, or any suitable boundary for normally terminating the performance of RDI or Why operations.

The boundary may be configurable or customizable in some embodiments and may be a default boundary in some other embodiments. For example, a designer may specify to perform one level of RDI operation to identify the RDI signal(s) for a target signal-cycle pair. In this example, various modules will perform one RDI operation comprising one or more structural analyses, one or more functional analyses, or any combinations thereof for the target signal-cycle pair to identify an RDI fanin cone and further to determine the RDI signals for the target signal-cycle pair.

As another example, a boundary may include a structural boundary such as the boundary of a particular instance so that various techniques described herein (e.g., the recursive RDI module) may recursively perform RDI operations to identify one or more RDI signals for a target signals, and then additional RDI signals for the one or more RDI signals, until the performance of RDI operations encounters the boundary of the instance in an electronic design of interest. As another example, a boundary may include the primary input of an electronic design or a portion thereof so that RDI operations will be performed for a target signal-cycle pair to identify RDI signals until the primary inputs are reached.

An RDI or Why operation includes an operation that may be performed to identify one or more RDI or Why signals for a target signal. An RDI or Why signal for a target signal-cycle pair corresponding to a target signal having a specific target signal value in a particular clock cycle includes a signal that contributes to the specific target signal value or the signal transition to the specific target signal value in the particular clock cycle for the target signal in some embodiments. Due to the complexity of modern electronic designs, an RDI signal for a target signal in a first clock cycle may or may not necessarily be an RDI signal for the same target signal in a second clock cycle. Similarly, a signal that is not an RDI signal for a target signal in a first clock cycle may nevertheless be an RDI signal for the same target signal in a second clock cycle.

An example of an RDI or Why signal includes an AND gate receiving a first input signal having the first signal value of "1" and a second input signal having the second signal value of "0" while having an output signal having the value of "0" in a particular clock cycle. In this example, the second input signal is determined to be an RDI or Why signal, while the first input signal is determined to be irrelevant to the AND gate. In this example, the second input signal is an RDI or a Why signal, and the operation performed for the target signal (the output signal) to identify the RDI or Why signals is an example of an RDI operation.

RDI signals for a target signal-cycle pair may be identified by, for example, the relevant driver identification module 102, in several different ways. For example, RDI signals may be identified in a pessimistic way by including only one or more signals that have been determined to be relevant to the target signal-cycle pair in some embodiments. In the aforementioned AND gate example, only the second input signal having the value of "0" is determined to be relevant to the output value "0" of the AND gate, and thus the RDI signal for the target output signal of the AND gate is the second input signal.

In some other embodiments, RDI signals may be determined in an optimistic manner to include signals that are not determined not to be irrelevant. In these embodiments, the RDI signals may or may not necessarily be relevant to the transition of the target signal-cycle pair. Yet in some other embodiments, RDI signals may be determined exactly by determining each signal that contributes to transition of the target signal of the target signal-cycle pair in to the target signal value in the specific clock cycle. In these latter embodiments, the RDI module 102 may perform one or more structural analyses, one or more functional analyses, or any combinations thereof for the target signal-cycle pair to identify an RDI fanin cone including one or more signals and to determine whether each of the one or more signals in the RDI fanin cone is relevant.

A debug graph may be generated at 206 at least by performing one or more levels of RDI operations for the signal-cycle pair based in part or in whole upon the boundary for RDI operations. In some of these embodiments, a single RDI or Why operation may be performed for the target signal-cycle pair to identify one or more first RDI signals that are determined to be relevant to the signal-target pair. In some other embodiments, recursive RDI or Why operations may be performed (e.g., by the recursive RDI module 104) to first identify one or more first RDI signals for the signal-cycle pair by performing a first RDI operation for the signal-cycle pair and then identify one or more second RDI signals for each of the one or more first RDI signals by performing an RDI or Why operations for each of the one or more first RDI signals, etc.

The process of performing one or more RDI operations at 206 normally terminates when the boundary for RDI operations is reached. For example, the performance of recursive RDI operations normally terminates at an instance boundary when the boundary is identified to be the instance boundary. As another example, the performance of recursive RDI operations normally terminates at the primary inputs when the primary inputs are identified to be the boundary for RDI operations. More details about generating a debug graph will be described below with reference to FIGS. 4A-B and 5D-J.

Figure 5C:
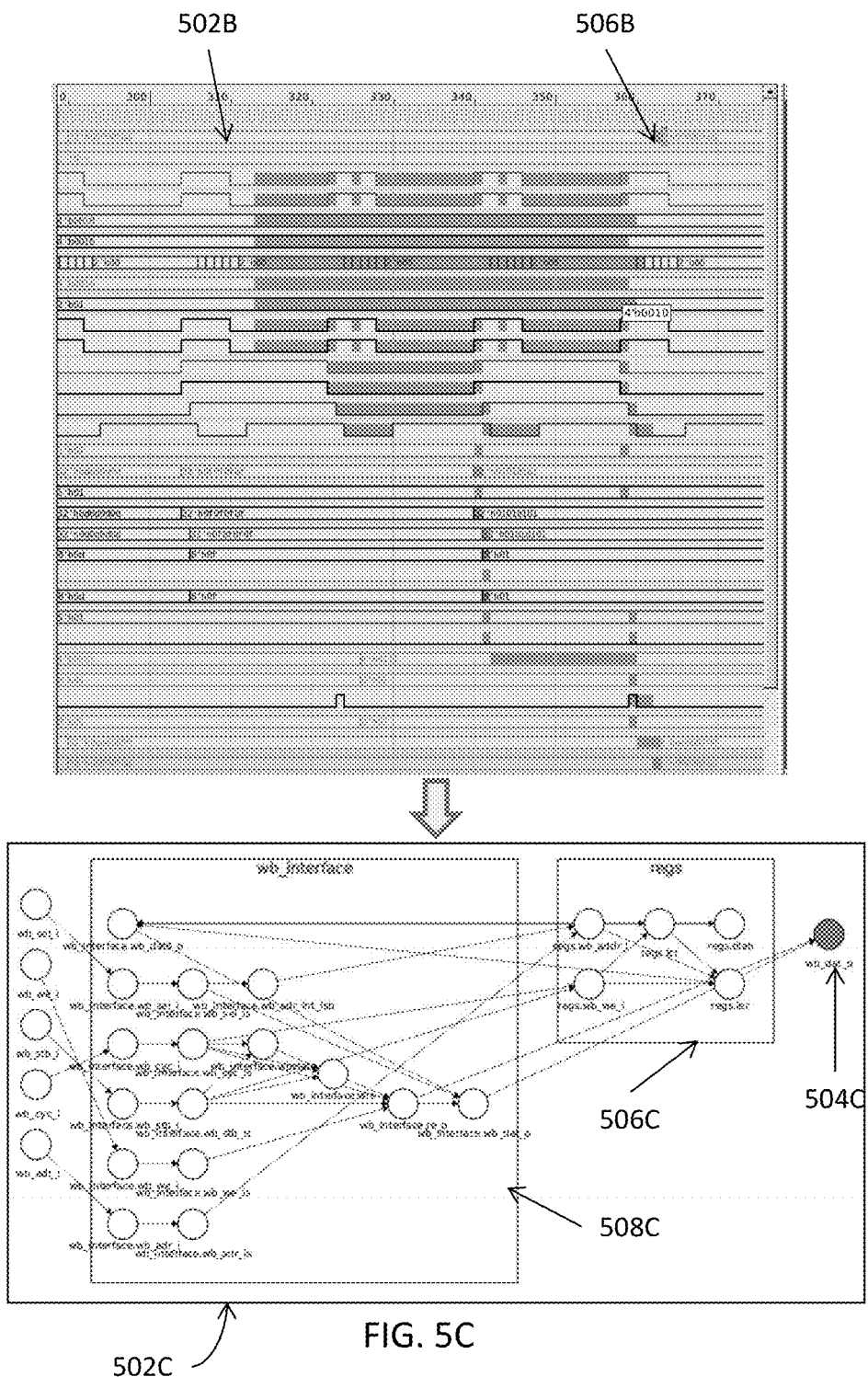
FIG. 5C illustrates an example of a debug graph constructed with various techniques described herein for the portion of the main debug or verification display module illustrated in FIG. 5B in one or more embodiments.

FIG. 5C illustrates an example of a debug graph constructed with various techniques described herein for the portion of the main debug or verification display module illustrated in FIG. 5B in one or more embodiments. A debug graph may be integrated and synchronized with the main debug or verification display module. In this example illustrated in FIG. 5C, when a user identifies a signal-cycle pair 506B in the functional information display area, a debug graph 502C may be constructed on the fly with the target node 504C representing the identified signal-cycle pair graphically emphasized. 506C and 508C in the debug graph 502C respectively indicate a first hierarchy and a second hierarchy in the electronic design of interest or a portion thereof.

The electronic design may be debugged or verified at 208 with the debug graph generated at 206, and the debugged or verified electronic design may be modified or updated as needed to correct any errors or issues encountered during the debugging or verification process and may be further sent to physical implementation tools (e.g., a floorplanner, a global routing engine, and/or a detail routing engine 164, a layout editor 166, a design rule checker 168, a verification engine 170, etc.), post-route verification and optimization tools, and sign-off tools to ensure that the electronic design is ready for manufacturing.

Figure 3:
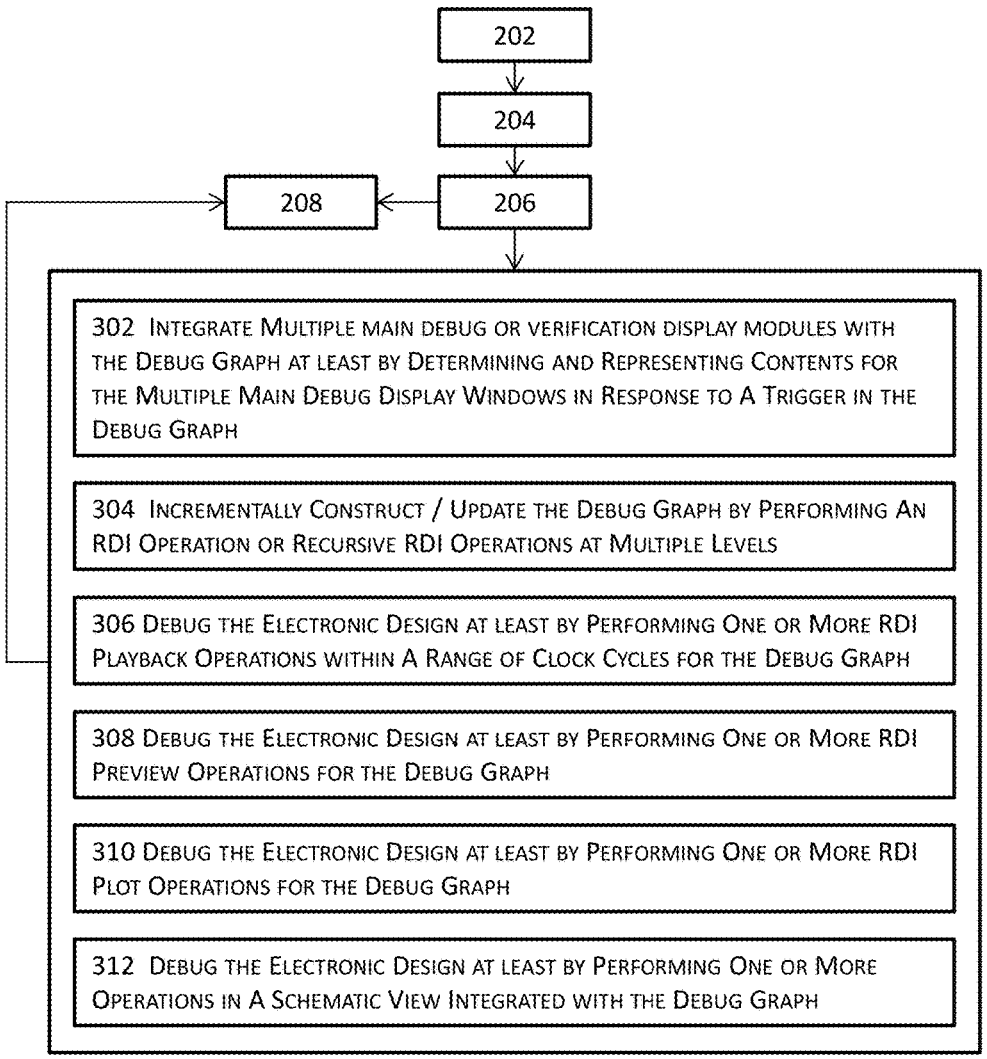
FIG. 3 illustrates a more detailed block diagram for graph-driven verification and debugging of an electronic design in one or more embodiments.

FIG. 3 illustrates a more detailed block diagram for graph-driven verification and debugging of an electronic design in one or more embodiments. In these embodiments, the block diagram may proceed through 202, 204, 206, and 208 in identical or substantially similar manners as those described above with reference to FIG. 2.

Multiple sub-modules in the main debug or verification display module may be integrated with the debug graph at 302 at least by determining, synchronizing, and/or representing contents for the multiple sub-modules in the main debug or verification display module in response to a trigger in the debug graph. In some embodiments, a trigger may include any manipulations in or to the debug graph by users in some embodiments or by one or more module described herein in some other embodiments. For example, a trigger may include the issuance of a command to plot RDI signals, to show source segments in the corresponding source code, to show and/or list drivers and/or loads, to create or show a schematic view, etc. A selection of an entity in the graph by users may automatically highlights the corresponding signal-cycle pair in the waveform, etc.

A trigger may also include the issuance of commands or invocation of a playback module to display how the electronic design of interest or a portion thereof transitions forward and backward within a range of clock cycles. By integrating the debug graph and the main debug or verification display module, the contents displayed in the debug graph and one or more sub-modules of the main debug or verification display module may be synchronized.

The debug graph may also be incrementally constructed or updated at 304 at least by performing an RDI operation or a plurality of recursive RDI operations at multiple levels. For example, a user may select a node in the debug graph and invoke a context menu (e.g., reference numeral 512R in FIGS. 5R-S) to instruct one or more modules described herein (e.g., the RDI module 102, the recursive RDI module 104, etc.) to further identify the RDI signal(s) for the selected node in the debug graph.

In the example illustrated in FIGS. 5R-S showing an original debug graph 502R constructed for the signal-cycle pair represented by node 510R in an electronic design of interest or a portion thereof 502R, the user selects node 508R, invoke the context menu 512R, and select the command "RDI Op on Graph" to perform an RDI operation for the selected node 508R. Various techniques described herein automatically invoke the appropriate module (e.g., the RDI module 102 for a single RDI operation) to determine the RDI signals for the selected node 508R.

In this example, these techniques identify three RDI signals (the original node 506R in FIG. 5R together with two additional node 502S and 504S) for the selected node 508R.

These techniques may further invoke the debug graph construction module 106 to update the original debug graph shown in FIG. 5R into the updated debug graph illustrated in FIG. 5S by placing the two additional nodes 502S and 504S into the debug graph 502R and further by connecting the nodes. In these figures, an arrowhead pointing from a first node to a second node in a debug graph indicates that the first node is an RDI signal for the second node.

The RDI signals as well as the original signal-cycle pair (e.g., the signal-cycle pair represented by node 510R) may be emphasized graphically, textually, or both in the same manner or in different manners. By providing the context menu including various commands (e.g., "RDI Op on Graph" to perform an RDI operation for a selected node, "RDI Ops on Graph" to perform recursive RDI operations for a selected node, "Driver on Graph" to identify driver(s) for a node, "Load on Graph" to identify load(s) for a node, etc.), the debug graph may be incrementally updated or expanded to include the details that a user desires to see). In some embodiments, a user may select multiple nodes (e.g., manually selecting these multiple nodes, selecting all nodes in one or more instances, selecting all nodes in the graph, etc.), invoke the context menu, and incrementally update a debug graph in a similar manner.

The electronic design may be debugged or verified at 306 at least by performing one or more RDI playback operations within a range of clock cycles for the debug graph. The range of clock cycles for a debug graph may be determined based in part or in whole upon the boundary for RDI or Why operations in some embodiments.

Figure 5D:
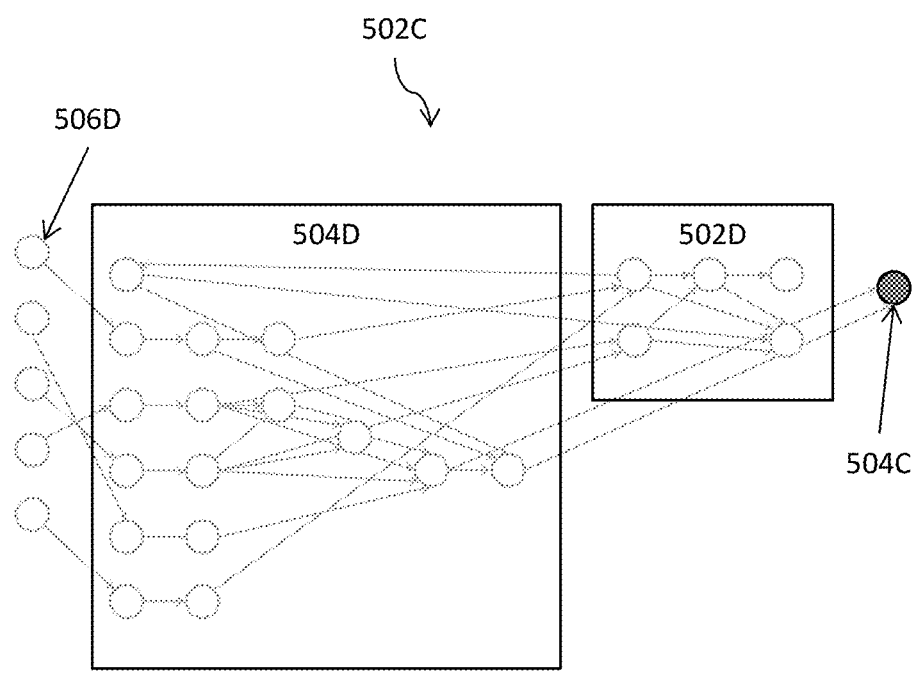
FIGS. 5D-J jointly illustrate an example of generating a debug graph using various techniques described herein for an pair of interest identified from a simulation or verification result in one or more embodiments.
Figure 5E:
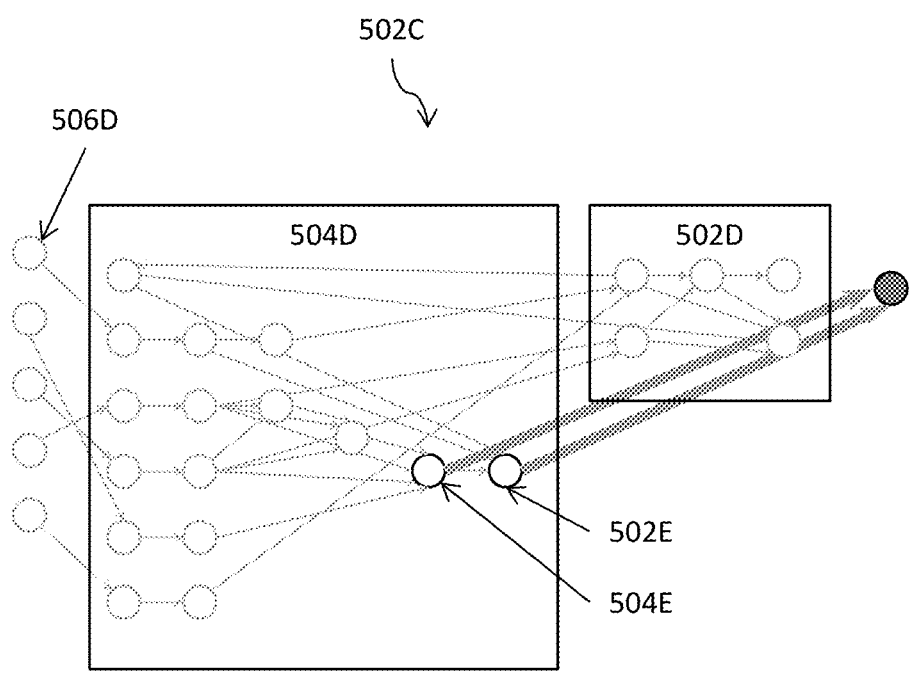
Figure 5F:
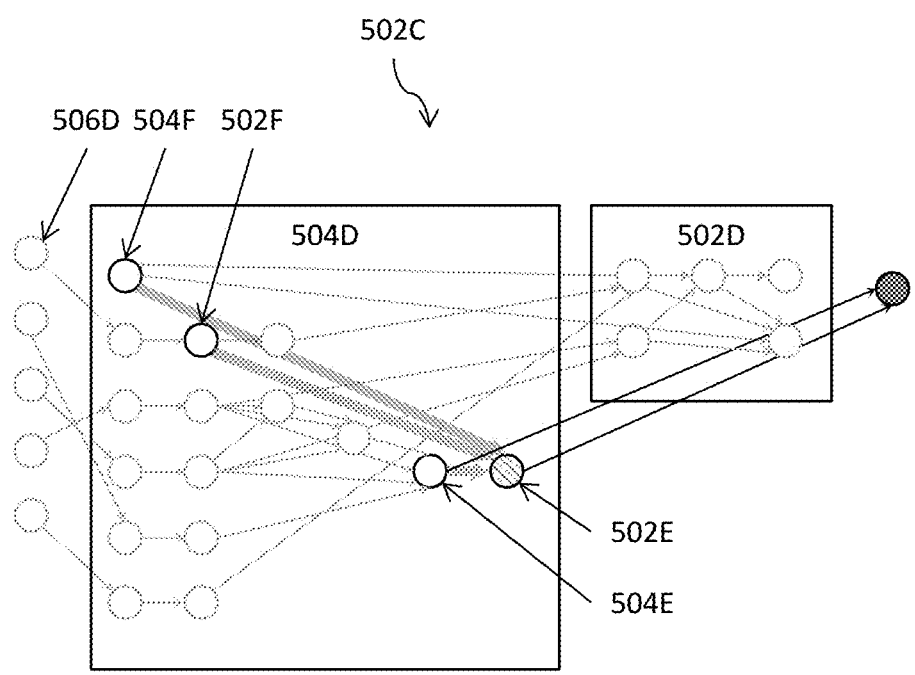
Figure 5G:
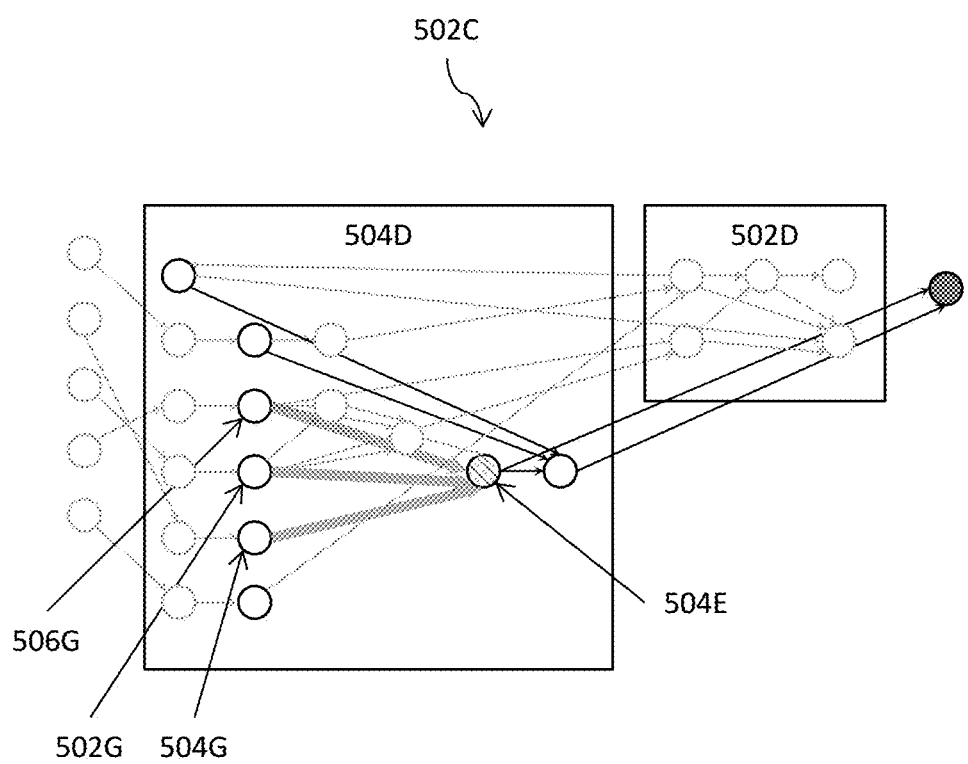
Figure 5H:
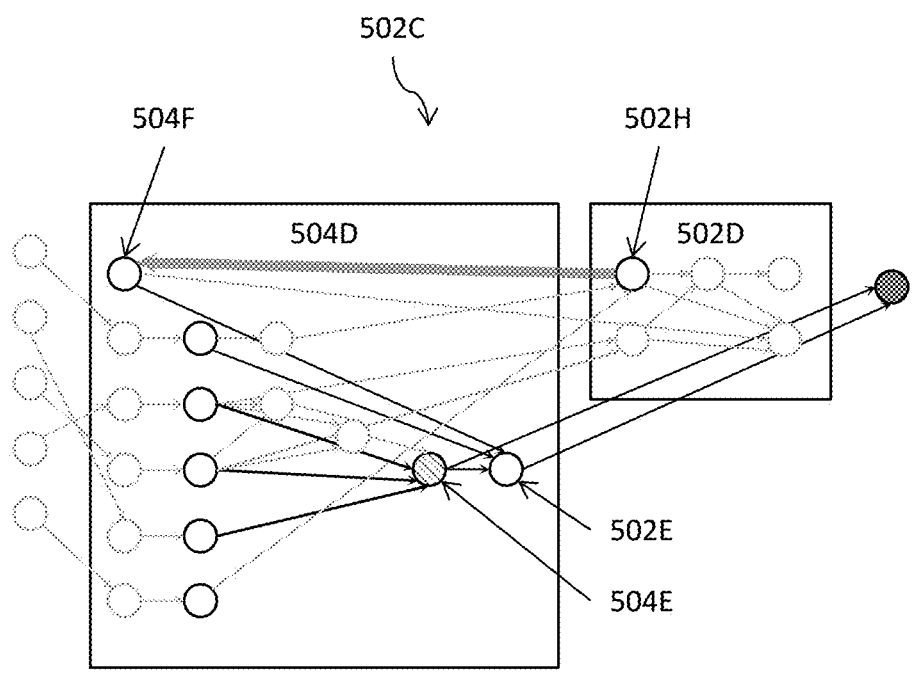
Figure 5I:
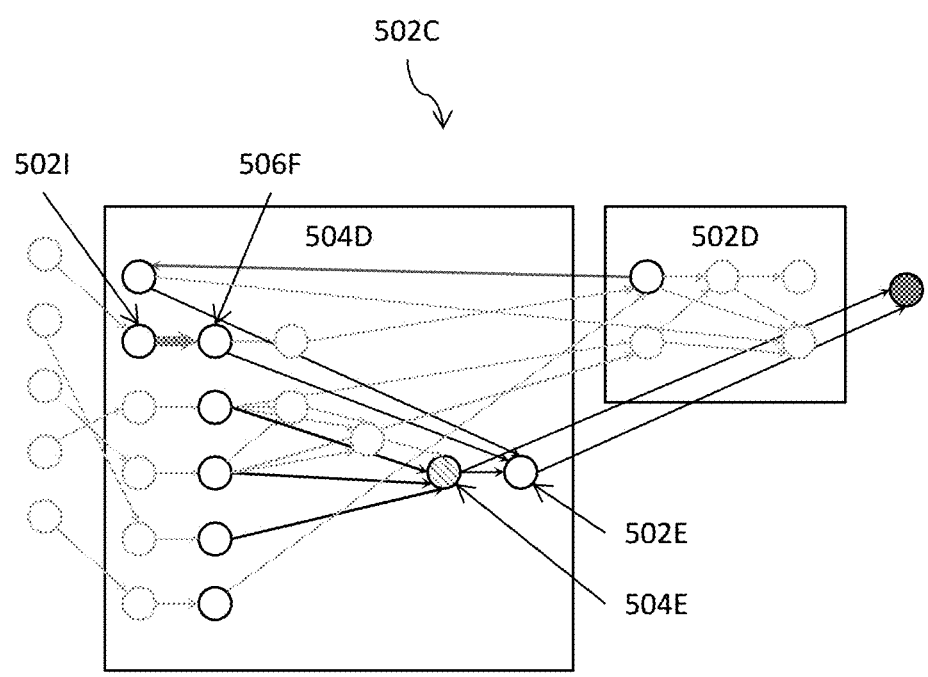
Figure 5J:
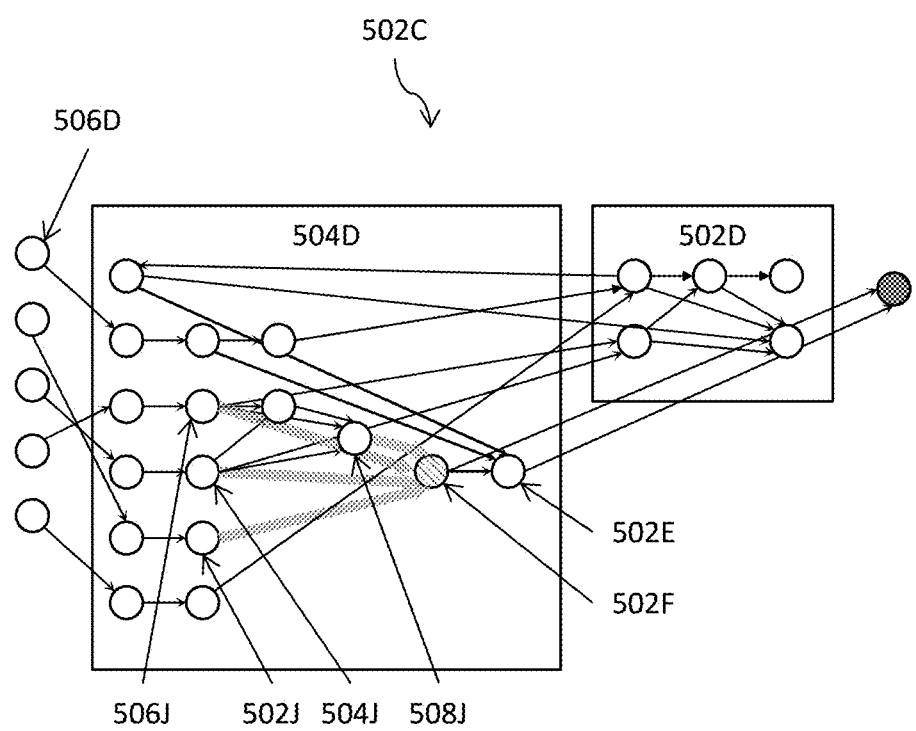
Figure 5K:
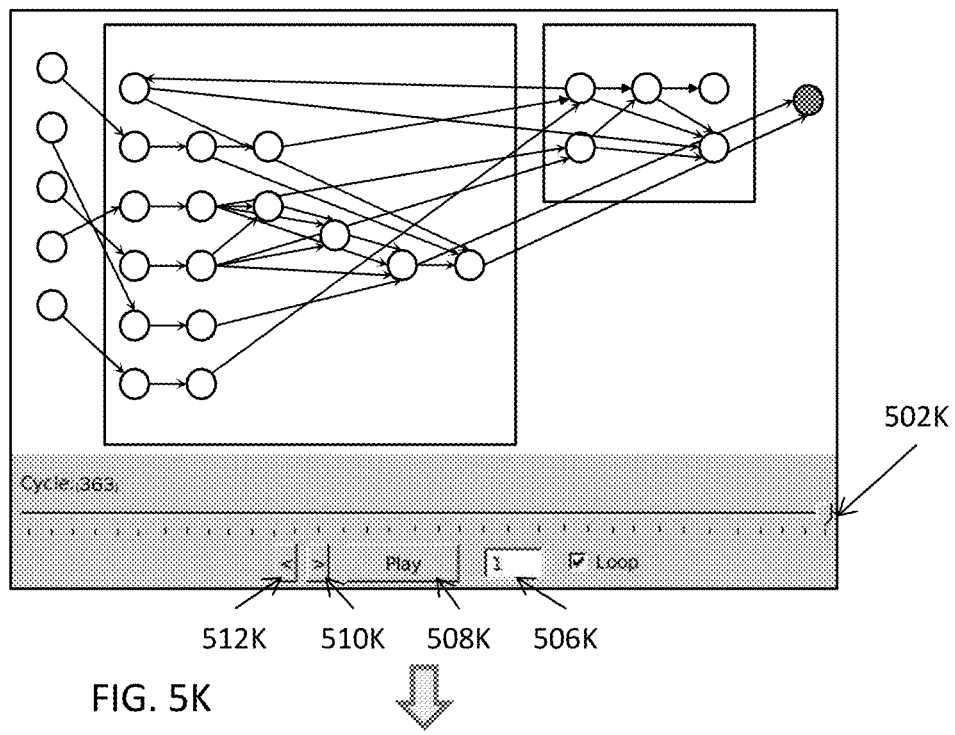
FIGS. 5K-L jointly illustrate an example of playback functionality of the debug graph provided by various techniques described herein in one or more embodiments.
Figure 5L:
Figure 5L:
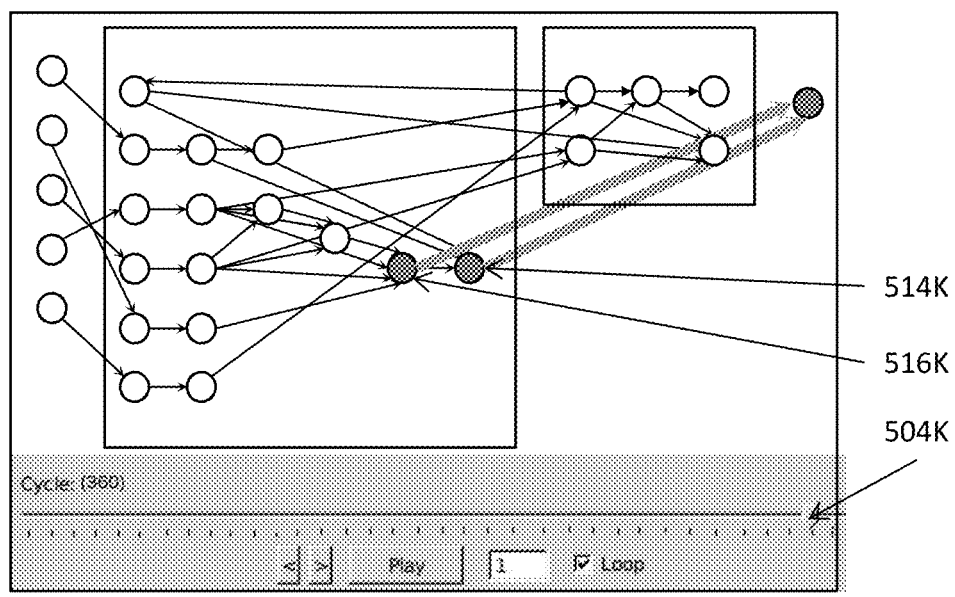

For example, when a user issues a command to display the electronic design backward (or forward) by a number of clock cycles by clicking on the backward arrow (e.g., reference numeral 512K in FIG. 5K) with the step for the number of clock cycles (e.g., the step specified in 506K of FIG. 5K), various modules described herein identified the RDI signals (e.g., 514K and 516K) for the target signal-cycle pair in the specific clock cycle (e.g., cycle no. 360 as shown by reference numeral 504K from the original clock cycle no. 363) and emphasized (e.g., graphically, textually, or both) the RDI signals in the debug graph as shown in FIG. 5L.

The user may similarly issue a command to display the debug forward from the current clock cycle (e.g., clock cycle 360 as shown by 504K) to the next clock cycle (e.g., clock 363 as shown by 502K) by clicking on the forward button (e.g., 510K in FIG. 5K) in the user interface for the debug graph. In the example illustrated in FIGS. 5K-L, the user may also identify a first specific clock cycle by positioning the cycle indicator (e.g., 502K or 504K), identify a second specific clock cycle by position the cycle indicator in the range of clock cycles accordingly, specify a step of play back by adjusting the playback step value 506K, and issue a command (e.g., by clicking on the "Play" button 508K). In response, the debug graph will how the displayed electronic design through these clock cycles at a configurable time interval between each update of the display contents.

The electronic design may be debugged or verified at 308 at least by performing one or more RDI preview operations for the debug graph. In some embodiments, the command to perform an RDI preview operation issues an inter-process function call to invoke the preview display module (e.g., reference numeral 110 in FIG. 1) which may be used to display information or data in response to the preview command. In these embodiments, the display information or data in response to the preview command is displayed in the preview display module, rather than or instead of in the main debug or verification display module, so as not to clutter the contents originally shown in the main debug or verification display module.

In some other embodiments, the displayed information or data in response to the preview command may be overlaid in the main debug or verification display module and may be removed in its entirety should a user so choose. The displayed information or data in response to the preview command is transient in nature and is not stored persistently in some embodiments. The preview operation is in contrast with the plot operation described below with reference to FIG. 5O-P in that the displayed information or data in response to a plot command may be persistently stored, while the displayed information or data in response to the preview command is transient in nature and may be replaced when another preview command is issued for a different entity (e.g., a node, an edge, etc. in a debug graph).

The electronic design may be debugged or verified at 310 at least by performing one or more RDI plot operations for the debug graph. In some embodiments, the displayed information or data in response to a plot command may be persistently stored. For example, the displayed information or data in response to a plot command may be persistently stored as an indexed view in a database (e.g., a relational database) for subsequent reference. A plot operation may be invoked through one or more context menus (e.g., by right clicking on a node or an edge in a debug graph). In the example illustrated in FIG. 5O-P, a user may right click on a node in a debug graph to bring up the first context menu (or context sensitive menu) 508O for the node.

In this example, the user may be presented with an option to choose from a set of plot operations such as "Driver" to display or emphasize, in the debug graph and also in a functional viewer (e.g., a waveform viewer 504D), the driver that contributes to the node upon which the Plot Driver command is issued. The corresponding edge (e.g., 502O) may also be graphically and/or textually emphasized in response. Various techniques may also highlight the relevant clock cycle range(s) in the functional viewer in response to the Plot Driver command. The user may also select another plot command such as "Load" to display the load(s) for the node upon which the plot command is received. The user may also select another plot command such as "Source", and various techniques described herein will automatically display and optionally emphasize the source code segment that corresponds to the node upon which the Plot Source command is issued. As shown in FIG. 5P, another option may bring up the highlight 504O in the waveform, or the relevant source code segment 506O.

The user may also right click on an edge in a debug graph to bring up the second context sensitive menu 510O for the edge. In this example, the user may also be presented with an option to choose from a different set of plot operations corresponding to edges that representing signal transitions. For example, the user may select Plot RDI Signals. In response to this command, the relevant portion in the source code causing the specific transition represented by the edge will be displayed and optionally emphasized (e.g., graphically, textually, or both graphically and textually) in a structural viewer (e.g., a source code browser).

The electronic design may be debugged or verified at 312 at least by performing one or more operations in a schematic view that is integrated with the debug graph. A schematic view may be generated in a configurable form including various levels of details from the debug graph or by using information or data from a debug graph either on demand (e.g., in response to a Show Schematic command as shown by 510O in FIG. 5O) or in advance. For an identified entity (e.g., a node or an edge) in a debug graph of a signal of interest in a range of clock cycles, a schematic view may be generated to include a textual and/or graphical schematic representation of the entity and one or more textual and/or graphical representations respectively corresponding to one or more RDI signals for the identified entity. The schematic view may include only the logic traversed in an RDI analysis, hiding irrelevant logic from the user.

In some other embodiments, a schematic view may include an expanded representation for an RDI signal, and the expanded representation includes all of the schematic symbol instance(s) having at least the interface element(s) (e.g., a textual and/or graphical representation of a pin of a schematic instance) along the path or net of the RDI signal. In some other embodiments, a schematic view may include a collapsed representation for an RDI signal, and the collapsed representation of the RDI signal does not include all the schematic symbol instances along the path or net of the RDI signal. Because a schematic view is generated from a debug graph, schematic views are thus clock cycle-aware because its basis—the debug graph—is generated for an identified signal-cycle pair and is thus made aware of the results of all the RDI operations at least in the range of cycles determined by the boundary of RDI operations.

Figure 5M:
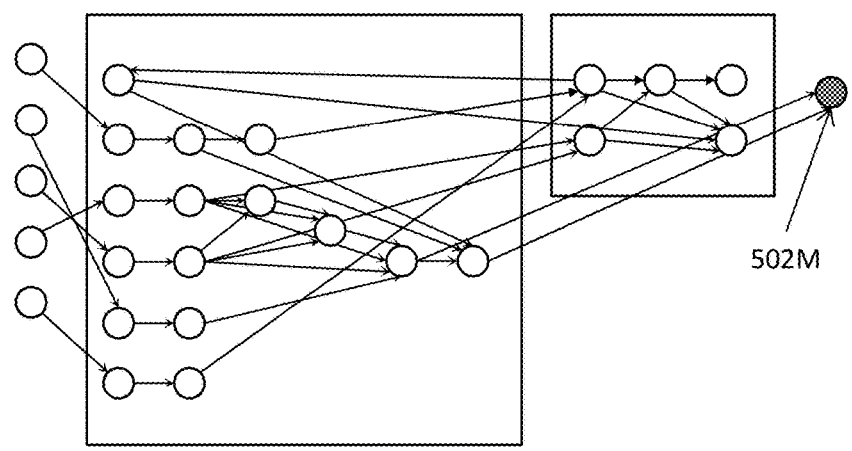
FIGS. 5M-P jointly illustrate an example of a debug graph integrated with a portion of a main debug or verification display module in one or more embodiments.
Figure 5N:
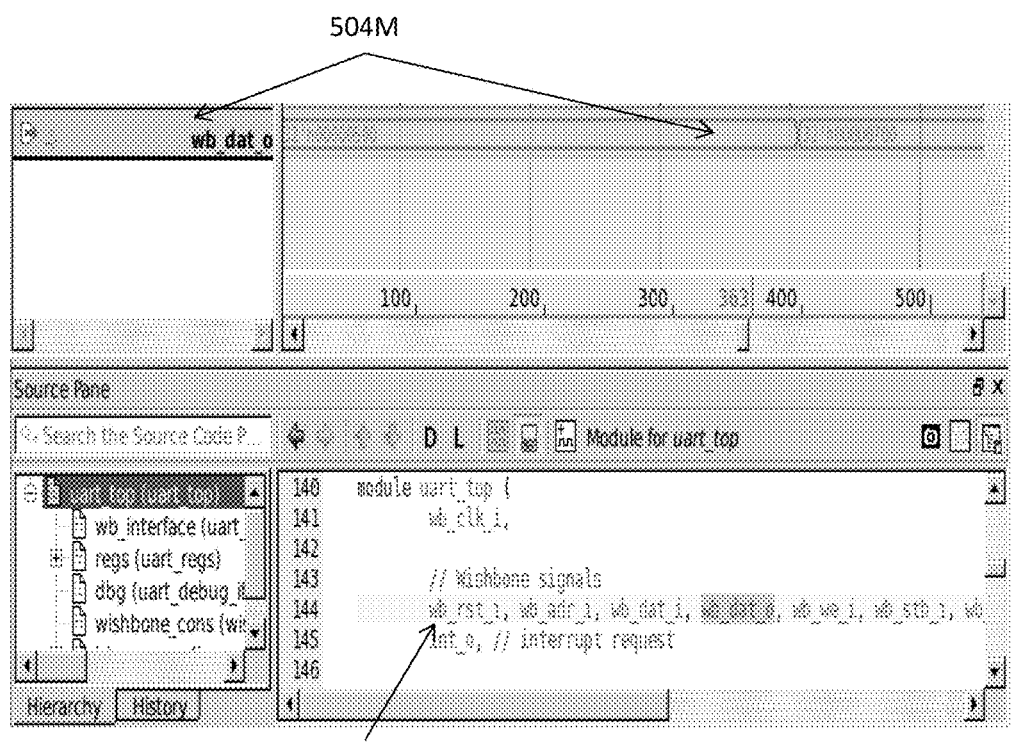
Figure 5O:
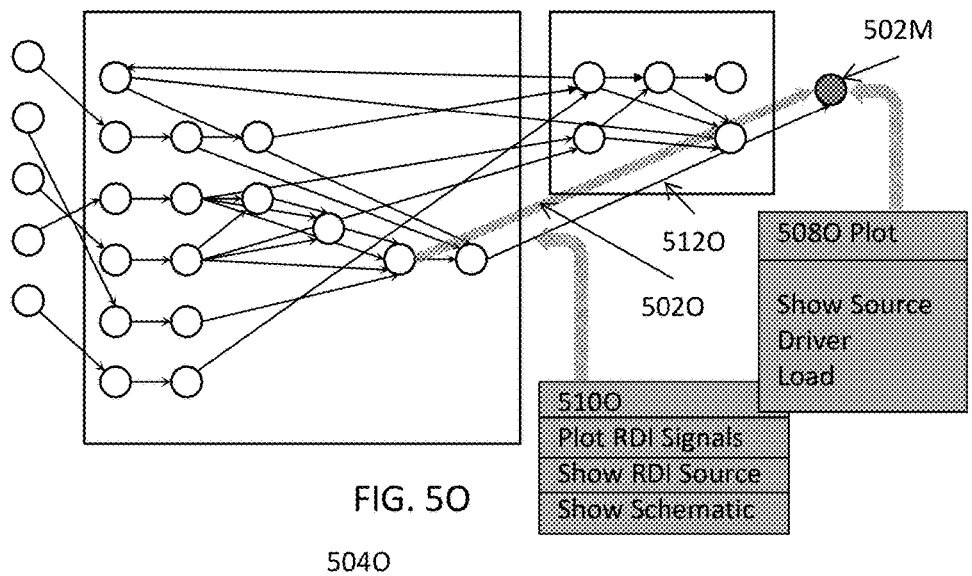
Figure 5P:
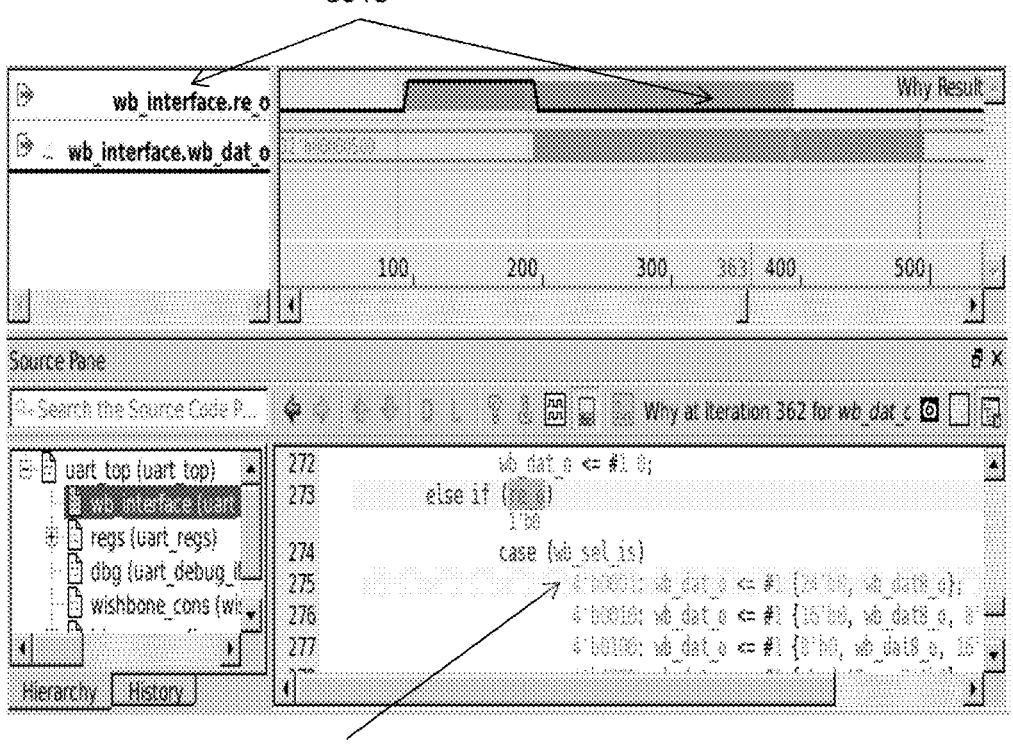
Figure 5Q:
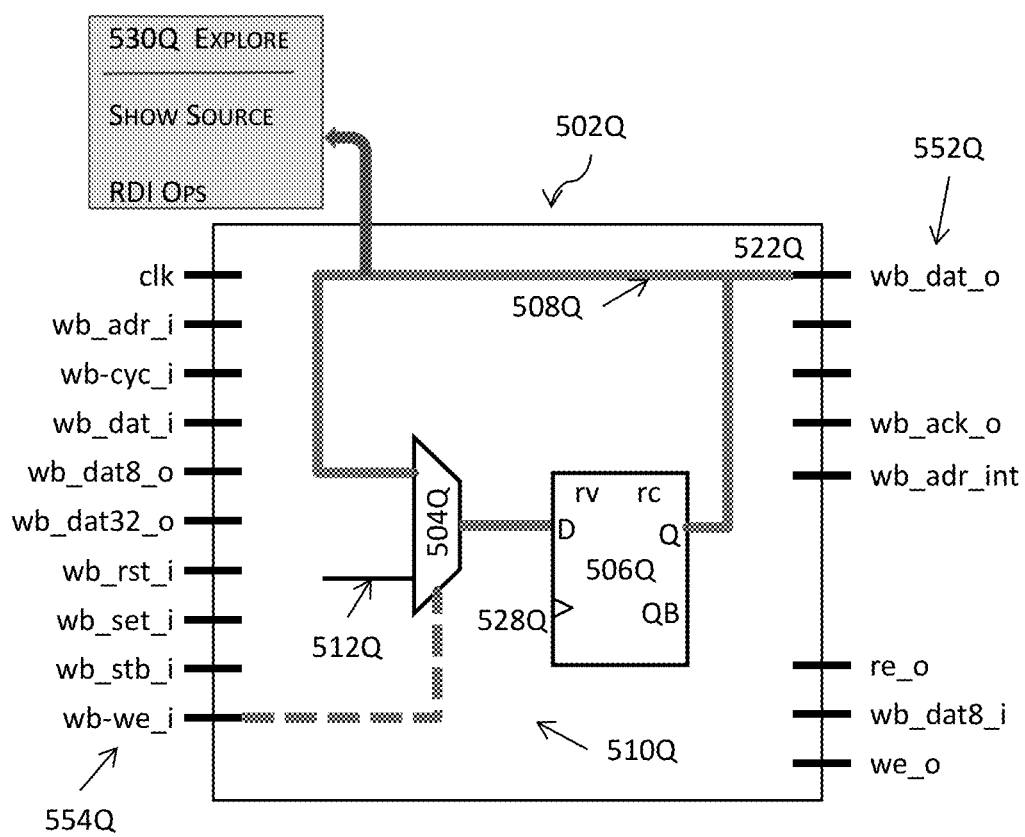
FIG. 5Q illustrates an example of a schematic view generated from a debug graph by using various techniques described herein in one or more embodiments.
Figure 5T:
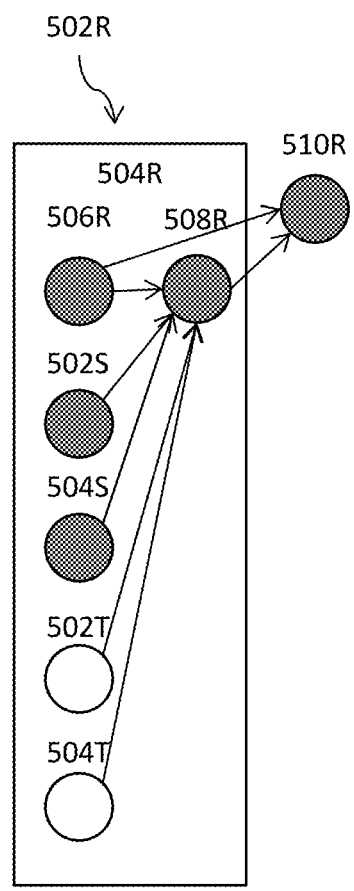
FIG. 5T illustrates another example of incremental generation of a debug graph in one or more embodiments.

FIG. 5Q illustrates an example of a schematic view generated from a debug graph by using various techniques described herein in one or more embodiments. In the example illustrated in FIG. 5O, a schematic view illustrated in FIG. 5Q may be invoked or generated on the fly the debug graph in response to a user's selection of the "Show Schematic" command (e.g., by right clicking on an edge in the debug graph connecting the signal-cycle pair and an RDI node) for an RDI signal of the target signal-cycle pair 504C (which refers to the signal "wb_dat_o" 552Q in FIG. 5Q). As FIG. 5Q illustrates, the schematic view 502Q includes the textual and graphical representation of the target signal 552Q corresponding to the target signal 502M in the originally identified signal-cycle pair.

The schematic view 502Q also includes an expanded connection or net 508Q that may include all the schematic instance symbols (e.g., the multiplexer 504Q and the D-type flip-flop 506Q) along this connection or net. The schematic view 502Q also includes a collapsed connection or net 510Q that does not include all the schematic instance symbols along this connection or net. In some embodiments, expanded nets or connections may be graphically and/or textually distinguished from collapsed nets or connections. In the example illustrated in FIG. 5Q, the expanded connection 508Q is represented as a solid line, and the collapsed net or connection 510Q is represented as a dashed line. The schematic view may also optionally include textual and/or graphical representations of interface elements such as the pin identifiers 552Q and 554Q in some embodiments.

Connections or nets in a schematic view may be respectively annotated with the respective identifiers (e.g., signal names or identifiers, pin names or identifiers, etc.) and/or the values of the corresponding signals in a current clock cycle of interest. For example, the connection 508Q may be annotated with the value "32'h000FF000F" (522Q) at the output 552Q; the connection 510Q may be annotated with the value "1'b1" for the select signal of the multiplexer 504Q. A current clock cycle of interest may include the clock cycle corresponding to the signal-cycle pair identified (e.g., at 202) or the clock cycle that a user selects (e.g., in the user interface illustrated in FIGS. 5K-L. The annotated signal values may also be dynamically updated based on the selection or identification of the current clock cycle of interest.

A schematic view not only serves the functions of displaying nodes and connections from a debug graph but may also be used to perform various other functions. For example, a context sensitive menu 530Q may be invoked (e.g., by right clicking on connection 508Q) to show the signal declaration (e.g., with the "Show Source" command in the context sensitive menu) in a structural viewer (e.g., a source browser) to indicate which source code segment causes the signal transition into the target signal value in a current clock cycle of interest. As another example, an RDI operation or recursive RDI operations may also be performed on a schematic view (e.g., by selecting the "RDI Ops" command in the context sensitive menu) to identify and display one or more RDI signals that are relevant to the signal transition into the target signal value in a current clock cycle of interest.

In various embodiments, the source code segment and the results of performing one or more RDI operations contain only the pertinent source code segment and the RDI signals that contribute to the signal transition into the target signal value in a current clock cycle of interest without showing other candidate source code segments or other candidate RDI signals that may possibly contribute to the signal transition into the target signal value in a current clock cycle of interest. This approach will not only reduce the computing resources required to store and display such "candidate source segments" and "candidate RDI signals" but also generate a clean and less cluttered representation for a user to focus on the actual signal declaration or RDI signals for a particular signal in a specific clock cycle (the current clock cycle of interest).

Figure 4A:
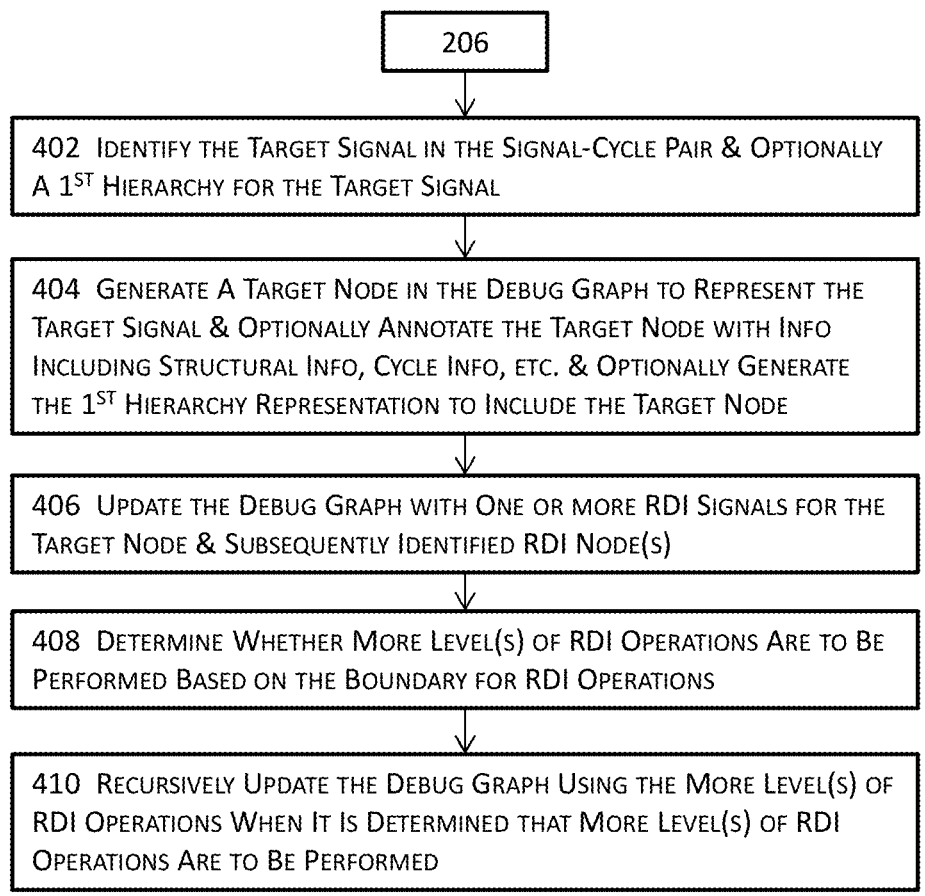
FIG. 4A illustrates a more detailed block diagram for a portion of the high level block diagram illustrated in FIG. 2 in one or more embodiments.

FIG. 4A illustrates a more detailed block diagram for a portion of the high level block diagram illustrated in FIG. 2 in one or more embodiments. More specifically, FIG. 4A illustrates more details about an act of generating a debug graph at 206 of FIG. 2. In these one or more embodiments, the target signal corresponding to the target signal-cycle pair identified at 202 may be identified at 402. The first hierarchy information for the target signal (e.g., a register, a flop, or other elements storing a value of the target signal in a specific clock cycle, etc.) may also be optionally identified at 402. The hierarchy information for the target signal may be used with other hierarchy information of other signals (e.g., RDI signals) to group the nodes in a debug graph so that the debug graph also demonstrates the hierarchical information of the electronic design of interest or a portion thereof.

A target node may be generated at 404 in the debug graph to represent the target signal that corresponds to the signal-cycle pair identified at 402. In some embodiments, the target node representing the target may be graphically and/or textually emphasized so that a user may easily track the focal points (the identified signal-cycle pair) of the task at hand. The debug graph may be further updated at 406 with one or more RDI operations for the target node and one or more subsequent determined RDI nodes, if available. An RDI operation may be first performed on the target node to first identify an RDI fanin cone for the target signal in the specific cycle by performing one or more structural and/or functional analyses and further by determining one or more first RDI signals for the target signal-cycle pair by analyzing the signals in the RDI fanin cone for their relevancy in an identical or a substantially similar manner as those described above with reference to FIGS. 2-3. More details about the act 406 will be further described below with reference to FIG. 4B.

A determination may be made at 408 to decide whether there exist more RDI operations to be performed to identify additional RDI signals. In some embodiments, a single RDI operation is performed for the target signal-cycle pair to identify the RDI signal(s) for the target signal in the specific clock cycle corresponding to the signal-cycle pair. In some other embodiments, recursive RDI operations may be performed to perform multiple levels of RDI operations—the first RDI operation on the target signal to identify one or more first RDI signals for the target signal, the second level RDI operations on the one or more first RDI signals to identify one or more second RDI signals for the one or more first RDI signals, etc.

The determination at 408 may be made based in part or in whole upon the boundary for RDI operations identified at 204 in some embodiments. In some embodiments where it is determined at 408 that recursive RDI operations are to be performed, the debug graph may be recursively updated at 410 using the results of these additional RDI operations performed on the one or more first RDI signals (and subsequent RDI signals, if available) to identify addition RDI signals. An example of generating a debug graph is provided in FIGS. 5D-J described below.

Figure 4B:
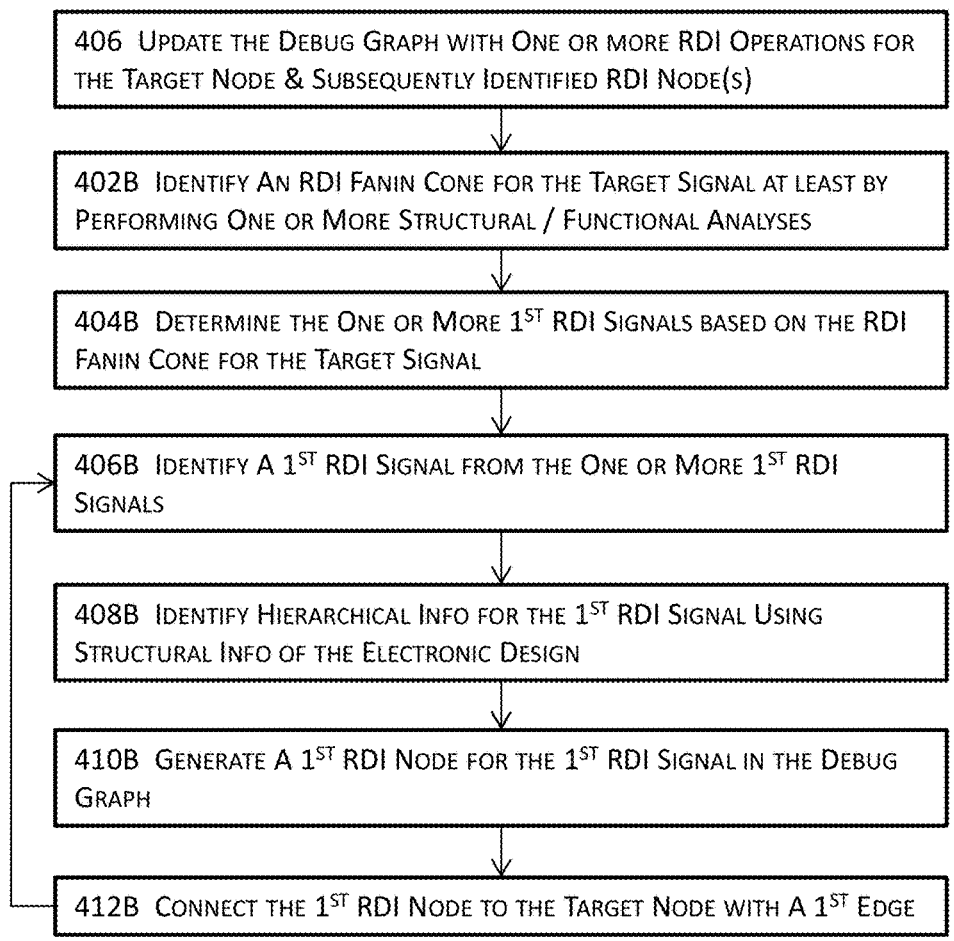
FIG. 4B illustrates a more detailed block diagram for a portion of the high level block diagram illustrated in FIG. 4A in one or more embodiments.

FIG. 4B illustrates a more detailed block diagram for a portion of the high level block diagram illustrated in FIG. 4A in one or more embodiments. More specifically, FIG. 4B illustrates more details about updating a debug graph with one or more RDI operations for the target node and one or more additional RDI nodes, if available. A first RDI operation may be first performed on the target node to determine an RDI fanin cone at 402B by performing one or more structural analyses, one or more functional analyses, or any combinations thereof on the electronic design of interest or a portion thereof with respect to the target signal corresponding to the target signal-cycle pair (e.g., the target signal-cycle pair identified at 202).

The RDI operation performed for the target node may then identify one or more first RDI signals at 404B from the signals in the RDI fanin cone. As described above, these one or more first RDI signals may be identified in a pessimistic way by including only these one or more signals that have been determined to be relevant to the target signal-cycle pair in some embodiments. In some other embodiments, these one or more first RDI signals may be determined in an optimistic manner to include signals that are not determined not to be irrelevant. In these embodiments, these one or more first RDI signals may or may not necessarily be relevant to the transition of the target signal-cycle pair. Yet in some other embodiments, these one or more first RDI signals may be determined exactly by determining each signal that contributes to transition of the target signal of the target signal-cycle pair in to the target signal value in the specific clock cycle.

A first RDI signal may be identified at 406B from the one or more first RDI signals for the target signal. These acts between 406B and 412B may be recursively performed until all first RDI signals have been processed. Hierarchical information for the first RDI signal identified at 406B may be identified at 408B by using at least some structural information of the electronic design of interest or a portion thereof. The hierarchy information for the target signal may be used with other hierarchy information of other signals (e.g., RDI signals) to group the nodes in a debug graph so that the debug graph also demonstrates the hierarchical information of the electronic design of interest or a portion thereof.

A first RDI node may then be generated in the debug graph at 410B to represent the first RDI signal identified at 408B. In addition, the first RDI node may then be connected to the target node with an edge at 412B. The process may then return to 406B to identify another first RDI signal and to repeat the processes between 406B and 412B until all the one or more first RDI signals have been processed.

In some embodiments where more than one RDI operation is to be performed, one or more second RDI operations may then be respectively performed for the one or more first RDI signals determined at 404B to identify the respective one or more second RDI signals for the one or more first RDI signals. The process may further recursively perform one or more additional RDI operations on the one or more second RDI signals to further identify more RDI signals for the one or more second RDI signals until, for example, the boundary for RDI operations has been reached.

FIGS. 5D-J jointly illustrate an example of generating a debug graph using various techniques described herein for an signal-cycle pair identified from a simulation or verification result in one or more embodiments. Generating a debug graph begins with the identification of a target signal-cycle pair (e.g., at 202). The target signal for the specific clock cycle corresponding to the clock-cycle pair may be represented as a node 504C in the debug graph. At this point, the debug graph 502C includes no other entities but node 504C representing the target signal. Reference numeral 502D, once added, in FIG. 5D represents a first instance in the electronic design of interest or a portion thereof, and reference numeral 504D, once added, in FIG. 5D represents a second instance in the electronic design of interest or a portion thereof. Reference numeral 506D, once added, in FIG. 5D represents the primary inputs in the electronic design of interest or a portion thereof.

An RDI or Why operation may be performed for the target signal 504C to identify the RDI signals for the target node 504C. In this example illustrated in FIG. 5E, RDI signals 502E and 504E may be identified as the RDI signals for the target node 504C. The debug graph may then be updated by adding nodes 502E and 504E into the debug graph and further by connecting these two nodes to the target node 504C. In this example illustrated in FIG. 5E, nodes 502E and 504E are respectively connected by two graphically highlighted arrowheads pointing to the target node 504C indicating that nodes 502E and 504E are the RDI signals for the target node 504C.

If recursive RDI operations are to be performed after the performance of the first RDI operation for the target node, a second RDI operation may be performed for each of the one or more first RDI signals to identify one or more second RDI signals for each of the one or more first RDI signals. These one or more second RDI signals may then be added to the debug graph. After the performance of second RDI operation for the one or more first RDI signals, the debug graph now includes nodes for both the one or more first RDI signals for the target signal and one or more second RDI signals for each of the one or more first RDI signals. These RDI nodes may then be connected according to the results of the RDI operations. In the example illustrated in FIG. 5F, an RDI operation is performed for one of the first RDI node 502E and identifies three RDI signals for the first RDI node 502E. These three RDI signals are represented as nodes 504E (which is also an RDI signal for the target node), 502F, and 504F. The connections may also be graphically and/or textually emphasized in the debug graph.

FIG. 5G illustrates a further updated debug graph 502C after the performance of another RDI operation for the other first RDI node 504E. The performance of another RDI operation identifies three additional RDI nodes, 502G, 504G, and 506G for node 504E. These three additional RDI nodes may be added to the debug graph and connected to node 504E to indicate that these three additional RDI nodes represent the RDI signals of the signal represented by node 504E.

FIG. 5H illustrates a further updated debug graph 502C after the performance of another RDI operation for an RDI node 504F that has been determined to represent an RDI signal for the signal represented by node 502E. The performance of another RDI operation an additional RDI node, 502H. This additional RDI node 502H may be added to the debug graph and connected to node 504F to indicate that this additional RDI node 502H represents the RDI signal of the signal represented by node 504F.

FIG. 5I illustrates a further updated debug graph 502C after the performance of another RDI operation for another RDI node 506F that has been determined to represent an RDI signal for the signal represented by node 502E. The performance of another RDI operation an additional RDI node, 502I. This additional RDI node 502I may be added to the debug graph and connected to node 506F to indicate that this additional RDI node 502I represents the RDI signal of the signal represented by node 506F.

FIG. 5J illustrates a further updated debug graph 502C after the performance of another RDI operation for another RDI node 502F that has been determined to represent an RDI signal for the signal represented by node 502E. The performance of another RDI operation four additional RDI nodes, 502J, 504J, 506J, and 508J. These four additional RDI nodes 502J, 504J, 506J, and 508J may be added to the debug graph 502C and connected to node 502F to indicate that these four additional RDI nodes 502J, 504J, 506J, and 508J represent the RDI signals of the signal represented by node 502F. By recursively performing RDI or Why operations on the original target signal represented by the original node 504C and subsequently determined RDI nodes, a debug graph 502C may be constructed as illustrated in FIG. 5J until a predetermined boundary for RDI or Why operations is reached. In this example illustrated in FIG. 5D-J, the predetermined boundary for RDI or Why operations is the primary input 506D. As a result, the recursive RDI module may recursively perform RDI or Why operations until the relevant RDI primary inputs 506D have been reached.

Figure 4C:
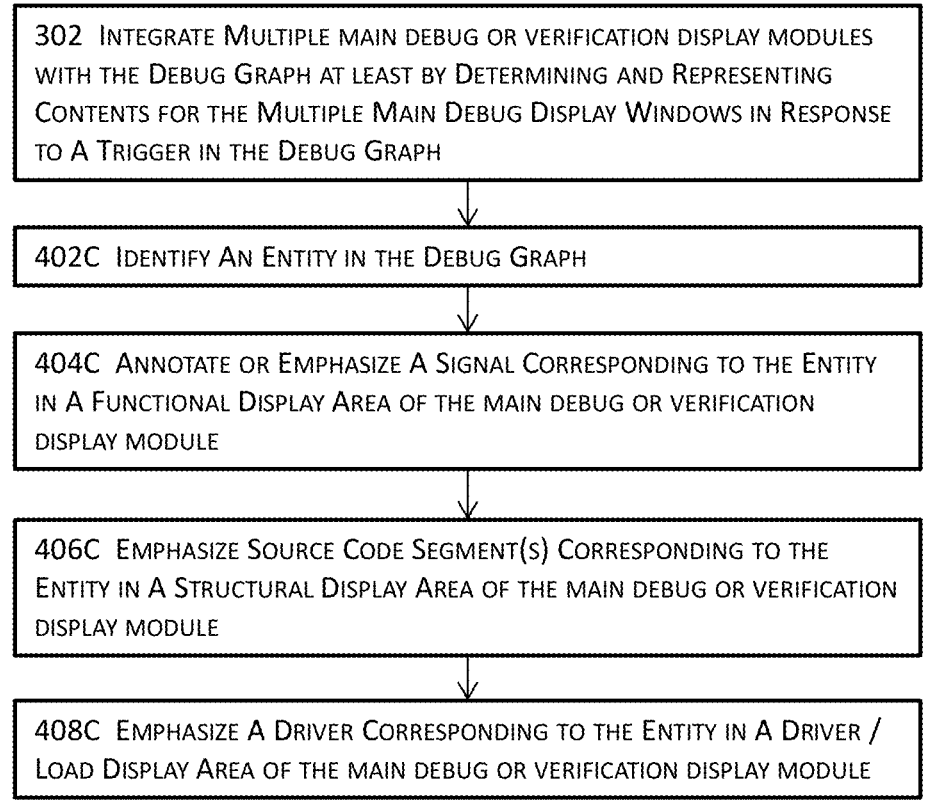
FIG. 4C illustrates a more detailed block diagram for a portion of the high level block diagram illustrated in FIG. 3 in one or more embodiments.

FIG. 4C illustrates a more detailed block diagram for a portion of the high level block diagram illustrated in FIG. 3 in one or more embodiments. More specifically, FIG. 4C illustrates more details about integrating a main debug or verification display module with the debug graph at 302 of FIG. 3. In these one or more embodiments, an entity may be identified at 402C in the debug graph. An entity may include a node or an edge in a debug graph where a node may represent a signal location (e.g., a register, a flop, etc.) in the electronic design, and an edge may represent a connection, a net, or a portion thereof between two signal locations in the electronic design. The operations on these entities are executed with respect to the context of the RDI operations that created them, including the "cycle" information for the signal location, and the "relevant logic" with which the RDI analysis has traversed for the portion thereof between two signal locations.

A signal corresponding to the entity may be annotated or emphasized at 404C to indicate the identification of the entity at 402C. For example, a waveform corresponding to an identification of a node may be highlighted in a functional display area of the main debug or verification display module. In some embodiments, the clock cycles or ranges of clock cycles in which one or more RDI signals for the identified node are determined to contribute to the identified node may also be emphasized in the functional display area (e.g., a waveform viewer) of the main debug or verification display module.

In the example illustrated in FIGS. 5M-N, a target node 502M is identified in the debug graph. With the integrated main debug display area illustrated in FIG. 5N, the waveform corresponding to the identified node 502M may be displayed and/or emphasized in a functional display area (e.g., a waveform viewer) 504M. In addition, the signal declaration for the identified node (representing a signal in a specific clock cycle) may also be displayed and/or emphasized in a structural display area 506M of the main debug or verification display module.

One or more source code segments or the signal declaration that corresponds to the identified entity may also be emphasized at 406C in a structural display area of the main debug or verification display module. For example, one or more source code segments corresponding to an identification of an edge in a debug graph may be graphically and/or textually emphasized in a structural display area (e.g., a source browser) of the main debug or verification display module. In some embodiments, only the signal declaration or the source code segments that actually contribute to the signal transition as represented by the edge will be emphasized in the structural display area. For example, signal declaration 506M shown in FIG. 5N and source code segment 506O shown in FIG. 5P.

The driver corresponding to the identified entity may also be emphasized at 408C in a driver/load display area of the main debug or verification display module. In some embodiments, only the driver that actually contributes to the signal transition as represented by the identified will be emphasized in the structural display area, while the other candidate drivers that may possibly contribute to yet do not actually contribute to the signal transition as represented by the identified entity will not be emphasized so as to present a clean set of information showing the actual cause to the effect represented by the identified edge.

Although the actual cause—the driver that actually contributes the target signal in the specific clock cycle—may also be included in the plurality of candidate drivers, such a display of the plurality of candidate driver not only distracts the user but also wastes computing resources in requiring more memory to store the plurality of candidate driver as well as more processing time to display the plurality of candidate driver. These techniques described herein with reference to at least FIG. 4B provides the driver that actually contributes to the signal transition for a signal of interest in a specific clock cycle and thus not only conserves computing resources but also better help the user to focus on the actual driver, instead of a plurality of candidate drivers.

Figure 4D:
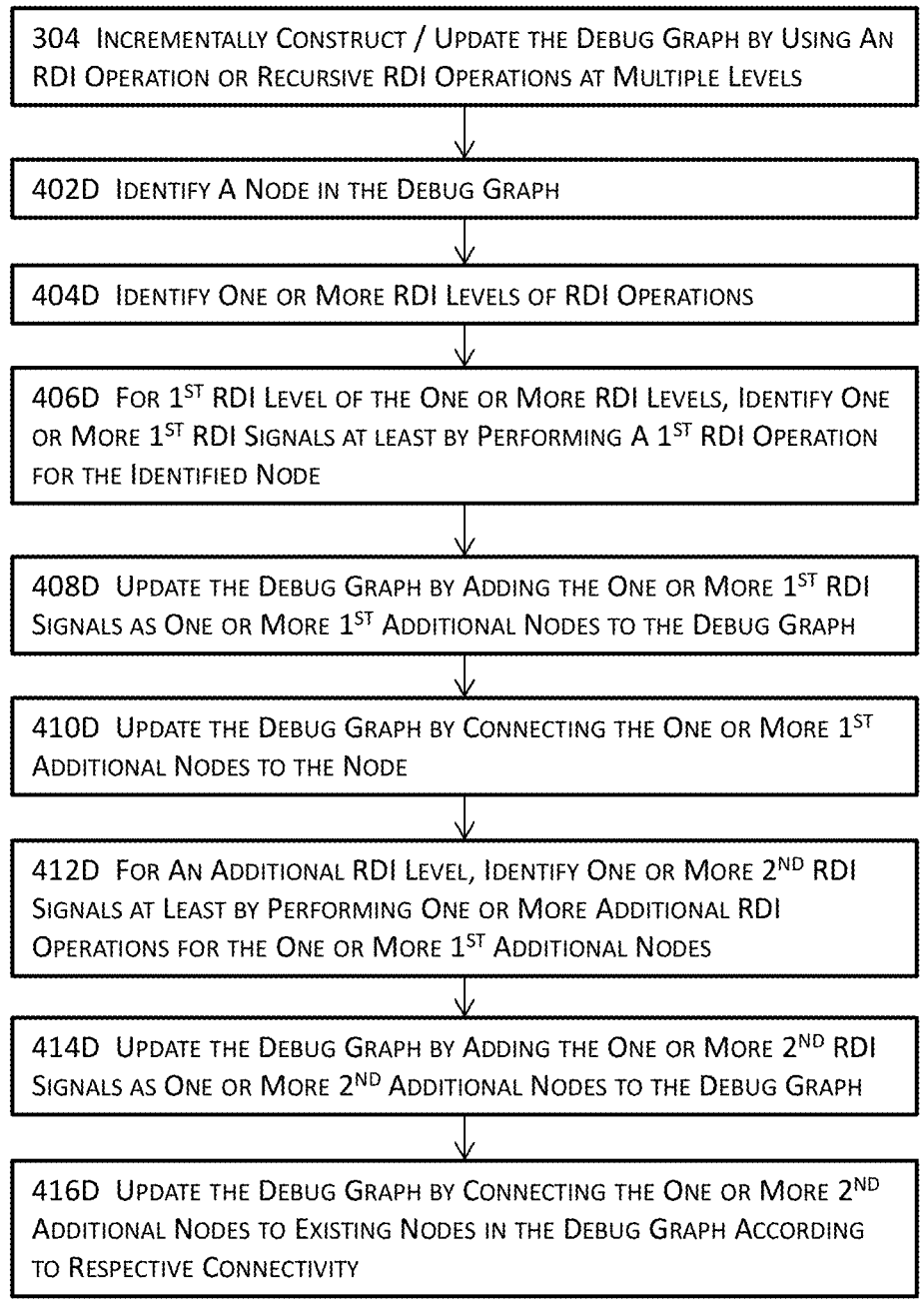
FIG. 4D illustrates a more detailed block diagram for a portion of the high level block diagram illustrated in FIG. 3 in one or more embodiments.

FIG. 4D illustrates a more detailed block diagram for a portion of the high level block diagram illustrated in FIG. 3 in one or more embodiments. More specifically, FIG. 4D illustrates more details about incrementally constructing or updating a debug graph at 302 of FIG. 3. A node may be identified at 402D in a debug graph. In the example illustrated in FIGS. 5R-T, the node 508R may be identified at 402D from a debug graph 502R. Debug graph 502R includes an instance 504R and a node 510R outside the instance 504R. The debug graph 502R also includes another node 506R in the same instance 504R as the node 508R.

One or more RDI levels of RDI operations may be identified at 404D. A single RDI operation represents one RDI level and may be performed for a specific signal to determine the RDI signals that contribute to the signal transition of the node identified at 402D. Recursive RDI operations may be grouped into multiple RDI levels where during the first RDI level, an RDI operation is performed for a target node to identify RDI signals for the target node, and additional RDI operations in one or more additional RDI levels may be further performed for the identified RDI signals to further identify other RDI signals that contribute to the signal transitions of these identified RDI signals.

RDI levels may be identified explicitly (e.g., performing three levels of RDI operations) in some embodiments or implicitly based in part or in whole upon the boundary for RDI operations. A context sensitive menu (e.g., 512R in FIG. 5R) may be invoked to perform a single RDI or Why operation (e.g., "RDI Op on Graph" in FIG. 5R) or to perform recursive RDI or Why operations (e.g., "RDI Ops on Graph" in FIG. 5R). The context sensitive menu may provide an option to show driver of a node in a debug graph.

When such a command is issued to show drivers of an identified node, all drivers will be added to the debug graph. In addition, because a debug graph is cycle aware, drivers that contribute to a node in a current clock cycle of interest may be distinguished from drivers that do not contribute to the same node in the current clock cycle of interest. These drivers that do not contribute to the same node in the current clock cycle of interest may nevertheless contribute to the signal transition of the node in other clock cycles and are thus identified as drivers. In the example illustrated in FIG. 5T, drivers 502T and 504T are added to the debug graph and connected to node 508R when a command is invoked to show drivers for node 508R (e.g., via the context sensitive menu 512R). These two drivers 502T and 504T are distinguishable from the other three drivers (506R, 502S, and 504S) in that drivers 502T and 504T do not contribute to the same node in the current clock cycle of interest. As the current clock cycle of interest is updated, these five drivers for node 508R may be emphasized differently.

For the first RDI level, one or more first RDI signals may be identified at 406D at least by performing a first RDI operation for the node identified at 402D. The debug graph may then be updated at 408D by adding and representing the one or more first RDI signals as one or more first additional RDI nodes in the debug graph. The debug graph may be further updated at 410D by connecting the one or more first additional nodes to the node identified at 402D. In the example illustrated in FIGS. 5R-T, the first RDI operation is performed for the identified node 510R to identify the RDI signals 506R and 508R. Anther RDI operation is performed for the node 508R to identify three RDI signals—502S, 504S, and 506R. These three RDI signals, 502S, 504S, and 506R, may then be added to the debug graph and connected to the identified node 508R as illustrated in FIG. 5S that shows an updated debug graph.

For an additional RDI level, one or more second RDI signals may be identified at 412D at least by perform one or more additional RDI operations respectively for the one or more first additional RDI nodes representing the one or more first RDI signals in the debug graph. The performance of these one or more additional RDI operations serves to identify RDI signals for each of the one or more first RDI signals. These RDI signals may be performed for nodes sequentially in some embodiments or in parallel in some other embodiments. Once these one or more second RDI signals are determined, the debug graph may be updated at 414D by adding and representing these one or more second RDI signals as one or more second RDI nodes in the debug graph. The debug graph may be further updated at 416D by connecting the one or more first RDI nodes to their respective one or more second RDI nodes. It shall be noted that although FIG. 4D illustrates two RDI levels of RDI operations, additional levels of RDI operations may be similarly performed.

Figure 4E:
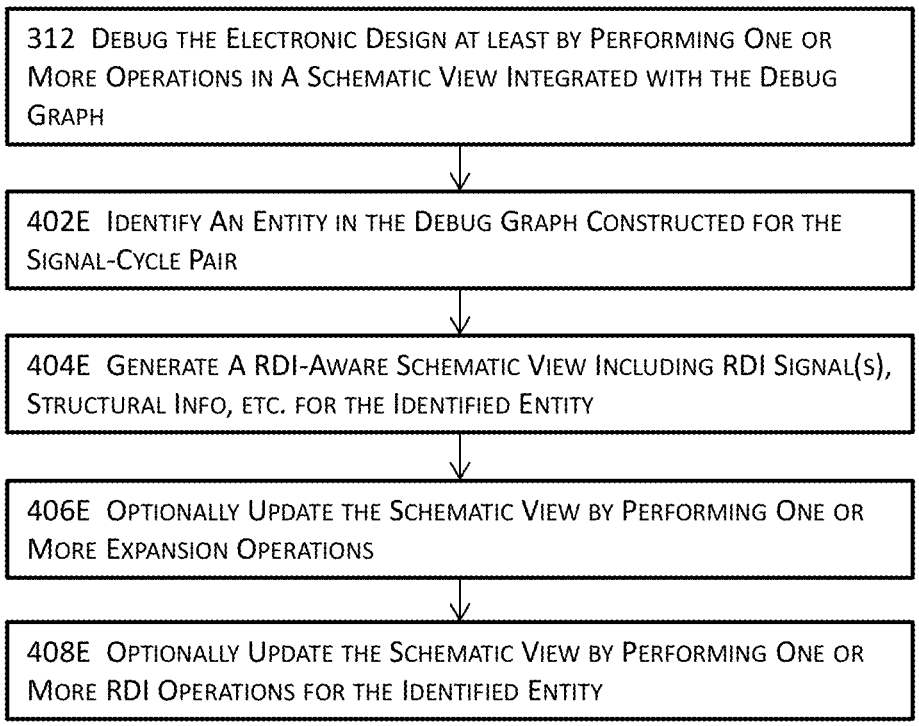
FIG. 4E illustrates a more detailed block diagram for a portion of the high level block diagram illustrated in FIG. 3 in one or more embodiments.

FIG. 4E illustrates a more detailed block diagram for a portion of the high level block diagram illustrated in FIG. 3 in one or more embodiments. More specifically, FIG. 4E illustrates more details about debugging an electronic design at least by performing one or more operations in a schematic view described above with reference to FIG. 3. In these one or more embodiments, an entity in a debug graph may be identified at 402E for the signal-cycle pair identified at 202. An entity may include a node or an edge in a debug graph where a node may represent a signal location (e.g., a register, a flop, etc.) in the electronic design, and an edge may represent a connection, a net, or a portion thereof between two signal locations in the electronic design. A schematic view may be generated at 404E in response to the entity identified at 402E. A schematic view may be RDI-aware because the schematic view may be generated from a debug graph that is in turn generated for an identified signal-cycle pair at least by performing one or more RDI operations across a range of clock cycles. This schematic view displays at least the logic deemed relevant by the RDI operation, hiding the irrelevant logic.

In the example illustrated in FIGS. 5O-Q, the edge 512O may be identified as the entity at 402E. A context sensitive menu may be invoked (e.g., by right clicking on the identified edge 512O) to provide a set of operations including a command to generate a schematic view (e.g., "Show Schematic" in 510O). A schematic view 502Q as shown in FIG. 5Q may be constructed in response to the invocation of the command "Show Schematic" from the context sensitive menu.

The schematic view may be optionally updated at 406E by performing one or more expansion operations. For example, any incomplete net or net segments, any collapsed representation of a net or a connection that does not include all the circuit components along the net or connection, any ports, pins, and terminals that are connected to an incomplete or missing net or net segment, etc. may be the subject of one or more expansion operations. For example, the collapsed connection or net 510Q may be partially or fully expanded in a configurable manner to include one or more additional schematic devices along the collapsed connection or net 510Q. As another example, the input pin 512Q may also be partially or fully expanded in a configurable manner to include one or more additional schematic devices in the fanin of the input pin 512Q. In some embodiments, an expansion operation may be invoked by the issuance of a command (e.g., by clicking or double clicking on the input pin 512Q).

The schematic view may also be optionally updated at 408E at least by performing one or more RDI operations or recursive RDI operations. Because a schematic view is cycle aware, the source code segment that actually causes the signal transition for a node or a connection in a specific clock cycle in a schematic view may also be precisely located and presented at 408E in a structural information display area of the main debug or verification display module. In the example illustrated in FIG. 5Q, a context sensitive menu 530Q may be invoked the connection 508Q to provide a set of operations including, for example, performing a single RDI operation, performing a plurality of RDI operations, performing recursive RDI operations, identifying the source code segment, etc.

System Architecture Overview

Figure 6:
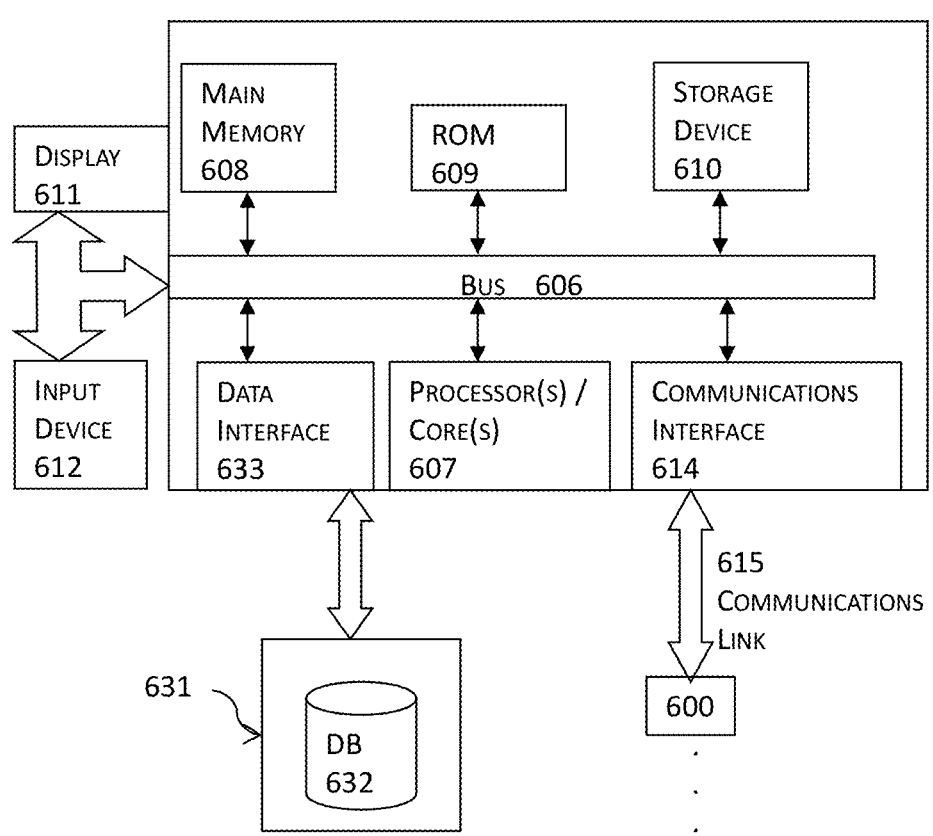
FIG. 6 illustrates a computerized system on which a method for graph-driven verification and debugging of an electronic design may be implemented.

FIG. 6 illustrates a block diagram of an illustrative computing system 600 suitable for graph-driven verification and debugging of an electronic design as described in the preceding paragraphs with reference to various figures. Computer system 600 includes a bus 606 or other communication module for communicating information, which interconnects subsystems and devices, such as processor 607, system memory 608 (e.g., RAM), static storage device 609 (e.g., ROM), disk drive 610 (e.g., magnetic or optical), communication interface 614 (e.g., modem or Ethernet card), display 611 (e.g., CRT or LCD), input device 612 (e.g., keyboard), and cursor control (not shown).

According to one embodiment, computing system 600 performs specific operations by one or more processor or processor cores 607 executing one or more sequences of one or more instructions contained in system memory 608. Such instructions may be read into system memory 608 from another computer readable/usable storage medium, such as static storage device 609 or disk drive 610. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

Various actions or processes as described in the preceding paragraphs may be performed by using one or more processors, one or more processor cores, or combination thereof 607, where the one or more processors, one or more processor cores, or combination thereof executes one or more threads. For example, various acts of determination, compression, decompression, etc. may be performed by one or more modules (e.g., one or more modules described in FIG. 1) including or functioning in tandem with one or more processors, one or more processor cores, or combination thereof.

A module described herein may also be implemented as a pure hardware module (e.g., a block of electronic circuit components, electrical circuitry, etc.) or a combination of a hardware module and a software block that jointly perform various tasks to achieve various functions or purposes described herein or equivalents thereof. For example, a module described herein may be implemented as an application-specific integrated circuit (ASIC) in some embodiments.

In these embodiments, a module may be stored at least partially in memory and may also include or function in tandem with, for example, a microprocessor or a processor core and other supportive electrical circuitry to perform specific functions which may be coded as software or hard coded as a part of an application-specific integrated circuit, ROM (read only memory), PROM (programmable read only memory), EPROM (erasable programmable read only memory), etc. despite the fact that these microprocessor, processor core, and electrical circuitry may nevertheless be shared among a plurality of module. A module described herein or an equivalent thereof may perform its respective functions alone or in conjunction with one or more other modules. A module described herein or an equivalent thereof may thus invoke one or more other modules by, for example, issuing one or more commands or function calls. The invocation of one or more other modules may be fully automated or may involve one or more user inputs. To the extent that a module includes a piece of software, the software is stored in a non-transitory computer accessible storage medium such as computer memory.

The term "computer readable storage medium" or "computer usable storage medium" as used herein refers to any non-transitory computer accessible storage medium that participates in providing instructions to processor 607 for execution. Such a medium may take many forms, including but not limited to, non-volatile media and volatile media. Non-volatile media includes, for example, optical or magnetic disks, such as disk drive 610. Volatile media includes dynamic memory, such as system memory 608. Common forms of computer readable storage media includes, for example, electromechanical disk drives (such as a floppy disk, a flexible disk, or a hard disk), a flash-based, RAM-based (such as SRAM, DRAM, SDRAM, DDR, MRAM, etc.), or any other solid-state drives (SSD), magnetic tape, any other magnetic or magneto-optical medium, CD-ROM, any other optical medium, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 600. According to other embodiments of the invention, two or more computer systems 600 coupled by communication link 615 (e.g., LAN, PTSN, or wireless network) may perform the sequence of instructions required to practice the invention in coordination with one another.

Computer system 600 may transmit and receive messages, data, and instructions, including program, i.e., application code, through communication link 615 and communication interface 614. Received program code may be executed by processor 607 as it is received, and/or stored in disk drive 610, or other non-volatile storage for later execution. In an embodiment, the computing system 600 operates in conjunction with a data storage system 631, e.g., a data storage system 631 that includes a database 632 that is readily accessible by the computing system 600. The computing system 600 communicates with the data storage system 631 through a data interface 633. A data interface 633, which is coupled with the bus 606, transmits and receives electrical, electromagnetic or optical signals that include data streams representing various types of signal information, e.g., instructions, messages and data. In embodiments of the invention, the functions of the data interface 633 may be performed by the communication interface 614.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

We claim:

1. A computer implemented method for graph-driven verification and debugging of an electronic design, comprising:
   identifying a pair of interest corresponding to a target signal and a clock cycle or an event associated with the target signal from a verification or simulation result of an electronic design or a portion thereof;
   identifying a boundary for relevant driver identification (RDI) operations;
   determining a plurality of candidate drivers at least by performing one or more RDI operations for the target signal based at least in part upon the boundary for the electronic design or the portion thereof based in part or in whole upon likelihood of relevancy to the pair;
   reducing the plurality of candidate drivers to a reduced number of contributing drivers at least by performing one or more analyses;
   generating, with a debug graph construction module stored at least partially in memory and functioning in conjunction with at least one computer processor, a debug display in a user interface, wherein the debug display includes and presents the reduced number of contributing drivers, at least one of the one or more RDI operations pertaining to the reduced number of contributing drivers, and corresponding source code segments pertaining in the user interface to a user; and
   readying the electronic design or a portion thereof for manufacturing at least by performing one or more verification or sign-off tasks to repair the electronic design or a portion thereof that is further integrated with the debug display in the user interface.

2. The computer implemented method of claim 1, further comprising:
   ensuring the electronic design is ready for manufacturing at least by generating a verified or debugged electronic design by verifying or debugging the electronic design using the debug display and by running the verified or debugged electronic design through sign-off.

3. The computer implemented method of claim 1, further comprising at least one of:
   verifying or debugging the electronic design or the portion thereof at least by performing one or more RDI playback operations within a range of clock cycles for the debug display;
   verifying or debugging the electronic design or the portion thereof at least by performing one or more RDI preview operations for the debug display; or
   verifying or debugging the electronic design or the portion thereof at least by performing one or more RDI plot operations for the debug display.

4. The computer implemented method of claim 1, further comprising:
   integrating the debug display with a main debug or verification display module comprising a functional information display sub-module and a structural information display sub-module at least by synchronizing the debug display with the main debug or verification display module.

5. The computer implemented method of claim 4, further comprising:
   identifying an entity in the debug display;
   emphasizing a signal corresponding to the entity in the functional information display sub-module of the main debug or verification display module;
   emphasizing a signal declaration corresponding to the entity in the structural information display sub-module of the main debug or verification display module; and
   emphasizing a driver corresponding to the entity in a driver or load display sub-module of the main debug or verification display module.

6. The computer implemented method of claim 1, further comprising:
   incrementally constructing or updating the debug display using at least an RDI operation or recursive RDI operations at multiple levels.

7. The computer implemented method of claim 6, further comprising:
   identifying a node in the debug display;
   identifying one or more RDI levels of RDI operations; and
   for a first RDI level of the one or more RDI levels, identifying one or more first RDI signals at least by performing a first RDI operation for the node identified in the debug display.

8. The computer implemented method of claim 7, further comprising:
   updating the debug display by adding the one or more first RDI signals as one or more first additional nodes to the debug display; and
   updating the debug display by connecting the one or more first additional nodes to the node identified in the debug display.

9. The computer implemented method of claim 8, further comprising:
   for an additional RDI level of the one or more RDI levels, identifying one or more second RDI signals at least by performing one or more additional RDI operation for one or more first additional nodes;
   updating the debug display by adding the one or more second RDI signals as one or more second additional nodes to the debug display; and
   updating the debug display by connecting the one or more second additional nodes to the one or more first additional nodes.

10. The computer implemented method of claim 1, generating and storing the debug display comprising:
    identifying the target signal corresponding to the pair of interest;
    generating a target node in the debug display to represent the target signal; and
    updating the debug display with one or more RDI signals for at least the target node.

11. The computer implemented method of claim 10, generating and storing the debug display comprising:
    determining whether one or more additional RDI operations are to be performed based in part or in whole upon the boundary for RDI operations; and
    when it is determined that the one or more RDI operations are to be performed, recursively updating the debug display using results of performance of the one or more additional RDI operations.

12. The computer implemented method of claim 10, updating the debug display with the one or more RDI signals further comprising:
    determining an RDI fanin cone for the target signal at least by performing one or more structural analyses, one or more functional analyses, or a combination of one or more functional analyses and one or more functional analyses; and
    determining the one or more RDI signals based in part or in whole upon the RDI fanin cone for the target signal.

13. The computer implemented method of claim 12, updating the debug display with the one or more RDI signals further comprising:
   identifying a first RDI signal form the one or more RDI signals;
   identifying hierarchical information for the first RDI signal using structural information of the electronic design or the portion thereof;
   representing the first RDI signal as a first RDI node in the debug display; and
   connecting the first RDI node to the target node with a first edge.

14. The computer implemented method of claim 1, further comprising:
   identifying an entity in the debug display;
   generating a schematic view comprising a schematic representation of the entity in response to identification of the entity; and
   synchronizing the schematic view with the debug display.

15. The computer implemented method of claim 14, further compressing at least one of:
   updating the schematic view at least by performing one or more one or more expansion operations; or
   updating the schematic view at least by performing one or more one or more RDI operations in the schematic view.

16. A system for verifying graph-driven verification and debugging of an electronic design, comprising:
   one or more modules, at least one of which is stored in part or in whole in memory and comprises at least one processor including one or more processor cores executing one or more threads in a computing system;
   a non-transitory computer accessible storage medium storing thereupon program code that includes a sequence of instructions that, when executed by the at least one processor, causes the at least one processor at least to:
   identify a pair of interest corresponding to a target signal comprising a clock cycle or an event associated with the target signal from a verification or simulation result of an electronic design or a portion thereof;
   identify a boundary for relevant driver identification (RDI) operations;
   determine a plurality of candidate drivers at least by performing one or more RDI operations for the target signal based at least in part upon the boundary for the electronic design or the portion thereof based in part or in whole upon likelihood of relevancy to the pair;
   reducing the plurality of candidate drivers to a reduced number of contributing drivers at least by performing one or more analyses;
   generate, with a debug graph construction module stored at least partially in memory and functioning in conjunction with at least one computer processor, a debug display in a user interface, wherein the debug display includes and presents the reduced number of contributing drivers, at least one of the one or more RDI operations pertaining to the reduced number of contributing drivers, and corresponding source code segments pertaining to the to a user in the user interface; and
   ready the electronic design or a portion thereof for manufacturing at least by performing one or more verification or sign-off tasks to repair the electronic design or a portion thereof that is further integrated with the debug display in the user interface.

17. The system of claim 16, wherein the program code includes the sequence of instructions that, when executed by the at least one processor, further cause the at least one processor to:
   incrementally construct or update the debug display using at least an RDI operation or recursive RDI operations at multiple levels.

18. The system of claim 17, wherein the program code includes the sequence of instructions that, when executed by the at least one processor, further cause the at least one processor to:
   identify a node in the debug display;
   identify one or more RDI levels of RDI operations;
   for a first RDI level of the one or more RDI levels, identify one or more first RDI signals at least by performing a first RDI operation for the node identified in the debug display;
   update the debug display by adding the one or more first RDI signals as one or more first additional nodes to the debug display; and
   update the debug display by connecting the one or more first additional nodes to the node identified in the debug display.

19. The system of claim 18, wherein the program code includes the sequence of instructions that, when executed by the at least one processor, further cause the at least one processor to:
   for an additional RDI level of the one or more RDI levels, identify one or more second RDI signals at least by performing one or more additional RDI operation for one or more first additional nodes;
   update the debug display by adding the one or more second RDI signals as one or more second additional nodes to the debug display; and
   update the debug display by connecting the one or more second additional nodes to the one or more first additional nodes.

20. An article of manufacture comprising a non-transitory computer accessible storage medium having stored thereupon a sequence of instructions which, when executed by at least one processor or at least one processor core executing one or more threads, causes the at least one processor or the at least one processor core to perform a set of acts for graph-driven verification and debugging of an electronic design, the set of acts comprising:
   identifying a pair of interest comprising a target signal and a clock cycle or an event associated with the target signal from a verification or simulation result of an electronic design or a portion thereof;
   identifying a boundary for relevant driver identification (RDI) operations;
   determining a plurality of candidate drivers at least by performing one or more RDI operations for the target signal based at least in part upon the boundary for the electronic design or the portion thereof based in part or in whole upon likelihood of relevancy to the pair;
   reducing the plurality of candidate drivers to a reduced number of contributing drivers at least by performing one or more analyses;
   generating, with a debug graph construction module stored at least partially in memory and functioning in conjunction with at least one computer processor, a debug display in a user interface, wherein the debug display includes and presents the reduced number of contributing drivers, at least one of the one or more RDI operations pertaining to the reduced number of contributing drivers, and corresponding source code segments pertaining in the user interface to a user; and readying the electronic design or a portion thereof for manufacturing at least by performing one or more verification or sign-off tasks to repair the electronic design or a portion thereof that is further integrated with the debug display in the user interface.

21. The article of manufacture of claim 19, the set of acts further comprising:

identifying the target signal corresponding to the pair of interest;

generating a target node in the debug display to representing the target signal; and updating the debug display with one or more RDI signals for at least the target node.

22. The article of manufacture of claim 20, the set of acts further comprising:

determining whether one or more additional RDI operations are to be performed based in part or in whole upon the boundary for RDI operations; and when it is determined that the one or more RDI operations are to be performed, recursively updating the debug display using results of performance of the one or more additional RDI operations.

23. The article of manufacture of claim 22, the set of acts further comprising:

identifying an RDI fanin cone for the target signal at least by performing one or more structural analyses, one or more functional analyses, or a combination of one or more functional analyses and one or more functional analyses; and determining the one or more RDI signals based in part or in whole upon the RDI fanin cone for the target signal.

24. The article of manufacture of claim 23, the set of acts further comprising:

identifying a first RDI signal form the one or more RDI signals;

identifying hierarchical information for the first RDI signal using structural information of the electronic design or the portion thereof;

representing the first RDI signal as a first RDI node in the debug display; and connecting the first RDI node to the target node with a first edge.

\* \* \* \* \*